US008390109B2

(12) United States Patent
Popovic et al.

(10) Patent No.: US 8,390,109 B2
(45) Date of Patent: Mar. 5, 2013

(54) CHIP PACKAGE WITH PLANK STACK OF SEMICONDUCTOR DIES

(75) Inventors: Darko R. Popovic, San Diego, CA (US); Matthew D. Giere, San Diego, CA (US); Bruce M. Guenin, San Diego, CA (US); Theresa Y. Sze, San Diego, CA (US); Ivan Shubin, San Diego, CA (US); John A. Harada, Mountain View, CA (US); David C. Douglas, Palo Alto, CA (US); Jing Shi, Carlsbad, CA (US)

(73) Assignee: Oracle America, Inc., Redwood Shores, CA (US)

( * ) Notice: Subject to any disclaimer, the term of this patent is extended or adjusted under 35 U.S.C. 154(b) by 56 days.

(21) Appl. No.: 13/029,825

(22) Filed: Feb. 17, 2011

(65) Prior Publication Data
US 2012/0211878 A1   Aug. 23, 2012

(51) Int. Cl.
*H01L 25/07* (2006.01)
*H01L 21/60* (2006.01)

(52) U.S. Cl. ......... 257/686; 257/E25.016; 257/E21.506; 257/685; 257/723; 257/777; 257/778; 257/734; 257/738; 257/728; 257/684; 257/784; 257/773; 257/774; 257/690

(58) Field of Classification Search .............. 257/686, 257/685, 723, 777, 778, 734, 738, 728, 684, 257/784, 773, 774, 690, E25.016, E21.506
See application file for complete search history.

(56) References Cited

U.S. PATENT DOCUMENTS

| | | | |
|---|---|---|---|
| 2005/0285252 A1* | 12/2005 | Nair | 257/690 |
| 2010/0035384 A1* | 2/2010 | Eichelberger et al. | 438/121 |
| 2011/0018120 A1* | 1/2011 | Drost et al. | 257/692 |
| 2012/0049376 A1* | 3/2012 | Harada et al. | 257/773 |
| 2012/0051695 A1* | 3/2012 | Harada et al. | 385/39 |
| 2012/0056327 A1* | 3/2012 | Harada et al. | 257/773 |

* cited by examiner

*Primary Examiner* — A O Williams
(74) *Attorney, Agent, or Firm* — Park, Vaughan, Fleming & Dowler LLP; Steven E. Stupp

(57) ABSTRACT

In a chip package, semiconductor dies in a vertical stack of semiconductor dies or chips (which is referred to as a 'plank stack') are separated by a mechanical spacer (such as a filler material or an adhesive). Moreover, the chip package includes a substrate at a right angle to the plank stack, which is electrically coupled to the semiconductor dies along an edge of the plank stack. In particular, electrical pads proximate to a surface of the substrate (which are along a stacking direction of the plank stack) are electrically coupled to pads that are proximate to edges of the semiconductor dies by an intervening conductive material, such as: solder, stud bumps, plated traces, wire bonds, spring connectors, a conductive adhesive and/or an anisotropic conducting film. Note that the chip package may facilitate high-bandwidth communication of signals between the semiconductor dies and the substrate.

20 Claims, 20 Drawing Sheets

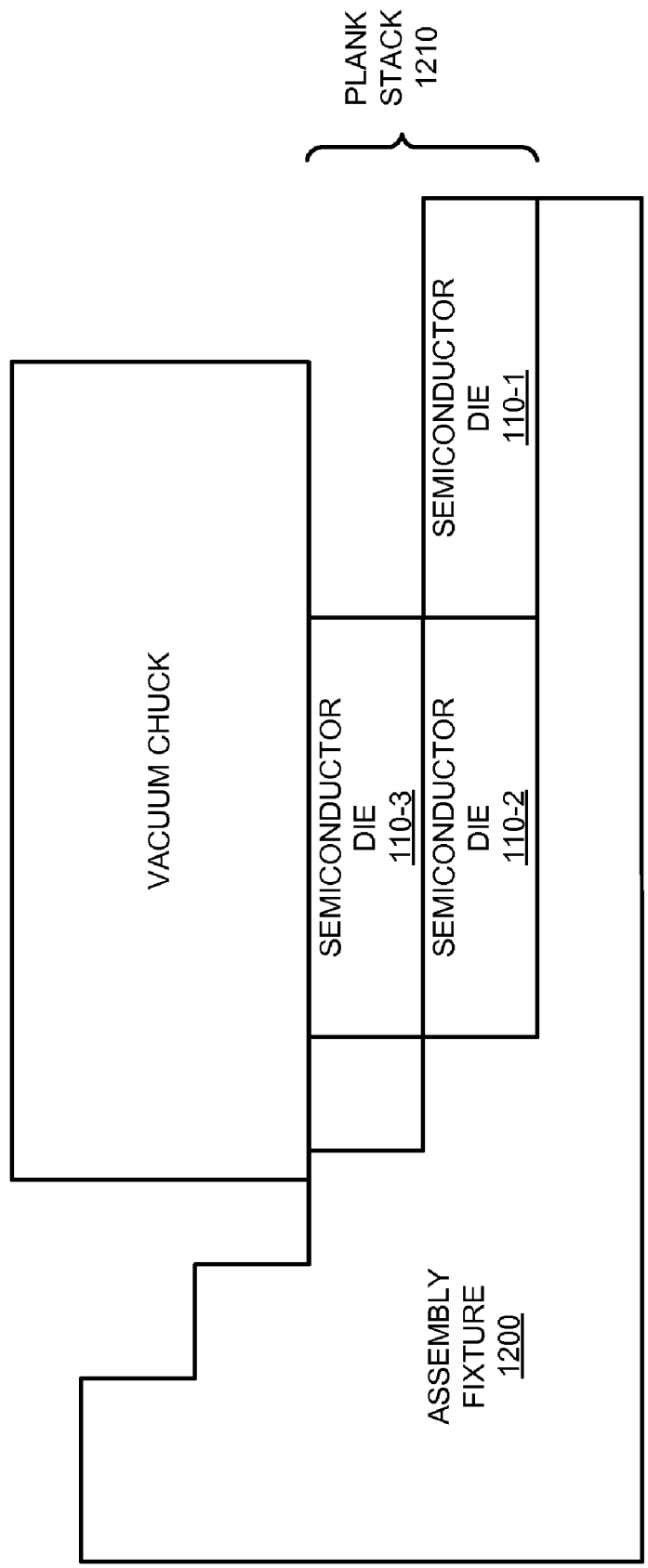

CHIP PACKAGE WITH PLANK STACK OF SEMICONDUCTOR DIES

BACKGROUND

1. Field

The present disclosure generally relates to the design of chip packages. More specifically, the present disclosure relates to a chip package that includes a group of semiconductor dies arranged in a plank stack and a substrate oriented at a right angle relative to the plank stack, and which communicates with the semiconductor dies.

2. Related Art

Chip packages that include stacked semiconductor chips can provide significantly higher performance in comparison to conventional individually packaged chips that are connected to a printed circuit board. These chip packages also provide certain advantages, such as the ability: to use different processes to fabricate different chips in the stack, to combine higher density logic and memory, and to transfer data using less power. For example, a stack of chips that implements a dynamic random access memory (DRAM) can use a high metal-layer-count, high-performance logic process in a base chip to implement input/output (I/O) and controller functions, and a set of lower metal-layer-count, DRAM-specialized processed chips can be used for the rest of the stack. In this way, the combined set of chips may have better performance and lower cost than: a single chip that includes the I/O and controller functions manufactured using the DRAM process; a single chip that includes memory circuits manufactured using a logic process; or a system constructed by attempting to use a single process to make both logic and memory physical structures.

It can, however, be difficult to obtain low-cost, high-performance (e.g., high-bandwidth) interconnections between the stacked chips. For example, the chips can be electrically coupled using wire bonds between exposed bond pads on surfaces in a stack of chips in which the chips are offset from one another to define a staircase of chip edges. But while these wire bonds can be implemented using low-cost assembly techniques, the resulting wire bonds typically have a low bandwidth.

In contrast, TSVs typically have a higher bandwidth than wire bonds. In a TSV fabrication technique, chips are processed so that one or more of the metal layers on their active face are conductively connected to new pads on their back face. Then, chips are adhesively connected in a stack, so that the new pads on the back face of one chip make conductive contact with corresponding pads on the active face of an adjacent chip.

However, TSVs typically have a higher cost than wire bonds. This is because TSVs pass through the active silicon layer of a chip. As a consequence, a TSV occupies area that could have been used for transistors or wiring. This opportunity cost can be large. For example, if the TSV exclusion or keep-out diameter is 20 µm, and TSVs are placed on a 30-µm pitch, then approximately 45% of the silicon area is consumed by the TSVs. This roughly doubles the cost per area for any circuits in the chips in the stack. (In fact, the overhead is likely to be even larger because circuits are typically spread out to accommodate TSVs, which wastes more area.) Furthermore, fabricating TSVs usually entails additional processing operations and yield loss, which also increase cost. In addition, TSVs typically limit the number of stacked semiconductor dies and usually present a significant challenge for thermal management when a large number of semiconductor dies are stacked.

Hence, what is needed is a chip package that offers the advantages of stacked semiconductor dies without the problems described above.

SUMMARY

One embodiment of the present disclosure provides a chip package. This chip package includes a group of semiconductor dies arranged in a plank stack in an x direction (which is sometimes referred to as a 'stacking direction'), where a plane of a given semiconductor die is defined by a z direction and a y direction, where the z direction, the x direction and the y direction are substantially perpendicular to each other. Note that the semiconductor dies include first electrical pads proximate to edges of the semiconductor dies, and the edges of the semiconductor dies define a face of the plank stack. Moreover, the chip package includes a mechanical spacer between pairs of semiconductor dies in the group of semiconductor dies. Furthermore, the chip package includes a substrate electrically coupled to the semiconductor dies along the x direction, where a plane of the substrate is defined by the x direction and the y direction. This electrical coupling to the semiconductor dies is between the first electrical pads, second electrical pads, which are proximate to a surface of the substrate along the x direction, and an intervening conductive material between the first electrical pads and the second electrical pads.

Note that the semiconductor dies may have a common orientation so that active electronics proximate to surfaces of the semiconductor dies are on a common side of the semiconductor dies. Alternatively, pairs of adjacent semiconductor dies in the plank stack may have opposite orientations so that the active electronics proximate to surfaces of the pairs of adjacent semiconductor dies face each other.

In some embodiments, the semiconductor dies include third electrical pads, proximate to the edges of the semiconductor dies along the y direction. In these embodiments, the substrate is also electrically coupled to the semiconductor dies along the y direction. In particular, the electrical coupling to the semiconductor dies is between the third electrical pads, fourth electrical pads, which are proximate to the surface of the substrate along the y direction, and the intervening conductive material between the third electrical pads and the fourth electrical pads. Moreover, the second electrical pads may include discrete pads or an electrical signal line (such as a bus) on the substrate.

Furthermore, the substrate may include: a semiconductor die, a ceramic, an organic material and/or glass. Note that the mechanical spacer may include spheres that define a spacing between the pairs of semiconductor dies. In some embodiments, the chip package includes spacer bumps, mechanically coupled to surfaces of the pairs of semiconductor dies, where the spacer bumps define the spacing between the pairs of semiconductor dies. These spacer bumps may be instead of or in addition to the mechanical spacer.

Moreover, the intervening conductive material may include: solder, partially ground conductive material having a modified aspect ratio than that of un-ground conductive material, stud bumps, plated traces, wire bonds, spring connectors that are electrically coupled to the substrate, traces defined using tape automated bonding, and/or a conductive adhesive. In some embodiments, the intervening conductive material extends beyond a guard ring associated with the given semiconductor die.

Note that the mechanical spacer may be recessed from the first electrical pads in spaces between the pairs of semiconductor dies. For example, the mechanical spacer may include a filler material (such as an adhesive) between the semiconductor dies, which may be sparsely distributed across the surfaces of the semiconductor dies or it may be arranged in a uniform grid pattern on the surfaces. Alternatively, the mechanical spacer may fill the spaces between the pairs of semiconductor dies down to the first electrical pads. Moreover, the mechanical spacer may include an adhesive.

In some embodiments, the semiconductor dies include fourth electrical pads proximate to additional edges of the semiconductor dies, where the additional edges of the semiconductor dies define another face of the plank stack. Moreover, the chip package may include another substrate that is electrically coupled to the semiconductor dies along the x direction or the y direction. Moreover, the electrical coupling to the semiconductor dies may be between the fourth electrical pads, fifth electrical pads, which are proximate to the surface of the substrate along the z direction, and the intervening conductive material between the fourth electrical pads and the fifth electrical pads.

Additionally, the chip package may include a heat sink thermally coupled to at least another face of the plank stack than the face of the plank stack, thereby extracting heat from one or more faces of the plank stack. In particular, semiconductor-die faces normal to the y and z directions may improve thermal coupling to the heat sink because they can facilitate unobstructed heat flow within the plane of each semiconductor die in the plank stack.

Note that the group of semiconductor dies may include at least two subsets of semiconductor dies that are separated by a gap along the x direction, where a given subset of the semiconductor dies includes at least two semiconductor dies.

Another embodiment provides a system (such as an electronic device and/or a computer system) that includes the chip package.

Another embodiment provides a method for fabricating the plank stack of semiconductor dies in the x direction. During this method, the semiconductor dies are stacked along the x direction into a plank stack, where the plane of the given semiconductor die is defined by the z direction and the y direction, where the z direction, the x direction and the y direction are substantially perpendicular to each other. Note that the semiconductor dies include the first electrical pads proximate to edges of the semiconductor dies, and the edges of the semiconductor dies define the face of the plank stack. Moreover, while stacking the semiconductor dies, a mechanical spacer may be provided between the pairs of semiconductor dies in the group of semiconductor dies. Furthermore, the substrate may be electrically coupled to the semiconductor dies along the x direction, where the plane of the substrate is defined by the x direction and the y direction. The electrical coupling to the semiconductor dies may be between the first electrical pads, second electrical pads, which are proximate to the surface of the substrate along the x direction, and the intervening conductive material between the first electrical pads and the second electrical pads.

In some embodiments, while stacking the semiconductor dies, a height of the plank stack is measured during assembly and a compressive pressure is adjusted to obtain desired spacing between the pairs of semiconductor dies, thereby facilitating electrical coupling to the second electrical pads proximate to the surface of the substrate.

Additionally, the stacking may occur before the semiconductor dies are diced from their associated wafers. Thus, wafer-level or die-level stacking may be used during the method.

BRIEF DESCRIPTION OF THE FIGURES

FIG. 12A is a block diagram illustrating assembly of a plank stack in the chip packages of FIGS. 1A-1D using an assembly fixture in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Embodiments of a chip package, a system that includes the chip package, and a method for fabricating a plank stack of semiconductor dies in the chip package are described. In this chip package, semiconductor dies in a vertical stack of semiconductor dies or chips (which is referred to as a 'plank stack') are separated by a mechanical spacer (such as a filler material or an adhesive). Moreover, the chip package includes a substrate at a right angle to the plank stack, which is electrically coupled to the semiconductor dies along an edge of the plank stack. In particular, electrical pads proximate to a surface of the substrate (which are along a stacking direction of the plank stack) are electrically coupled to pads that are proximate to edges of the semiconductor dies by an intervening conductive material, such as: solder, stud bumps, plated traces, wire bonds, spring connectors, traces defined using tape automated bonding, a conductive adhesive and/or an anisotropic conducting film. Note that the chip package may facilitate high-bandwidth communication of signals between the semiconductor dies and the substrate.

This chip-stacking technique may facilitate improved three-dimensional (3D) stacks of semiconductor dies relative to existing techniques (such as through-silicon vias or TSVs, wire bonding, etc.). In particular, the plank stack may accommodate a significantly larger number of semiconductor dies. By removing the need for costly and area-consuming TSVs in the semiconductor dies, the cost of the chip package may be reduced. For example, the cost may be reduced by avoiding the processing operations and the wasted area associated with TSVs in the semiconductor dies. Thus, the chips in the plank stack may be fabricated using standard processing. Moreover, the approximately perpendicular configuration of the semiconductor dies and the substrate may increase the density and may offer improved thermal management unconstrained by the number of semiconductor dies. Furthermore, the substrate can offer a first-level interconnect with a higher inter-component communication bandwidth and reduced latency than wire bonding, and can have comparable communication bandwidth and latency to those offered by semiconductor dies that include TSVs. In addition, the chip-stacking technique may facilitate direct and simultaneous access to each semiconductor die in the plank stack. Consequently, the chip package can facilitate low-cost, low-latency, low-power and/or high-performance 3D stacks of semiconductor dies.

Figure 1A:
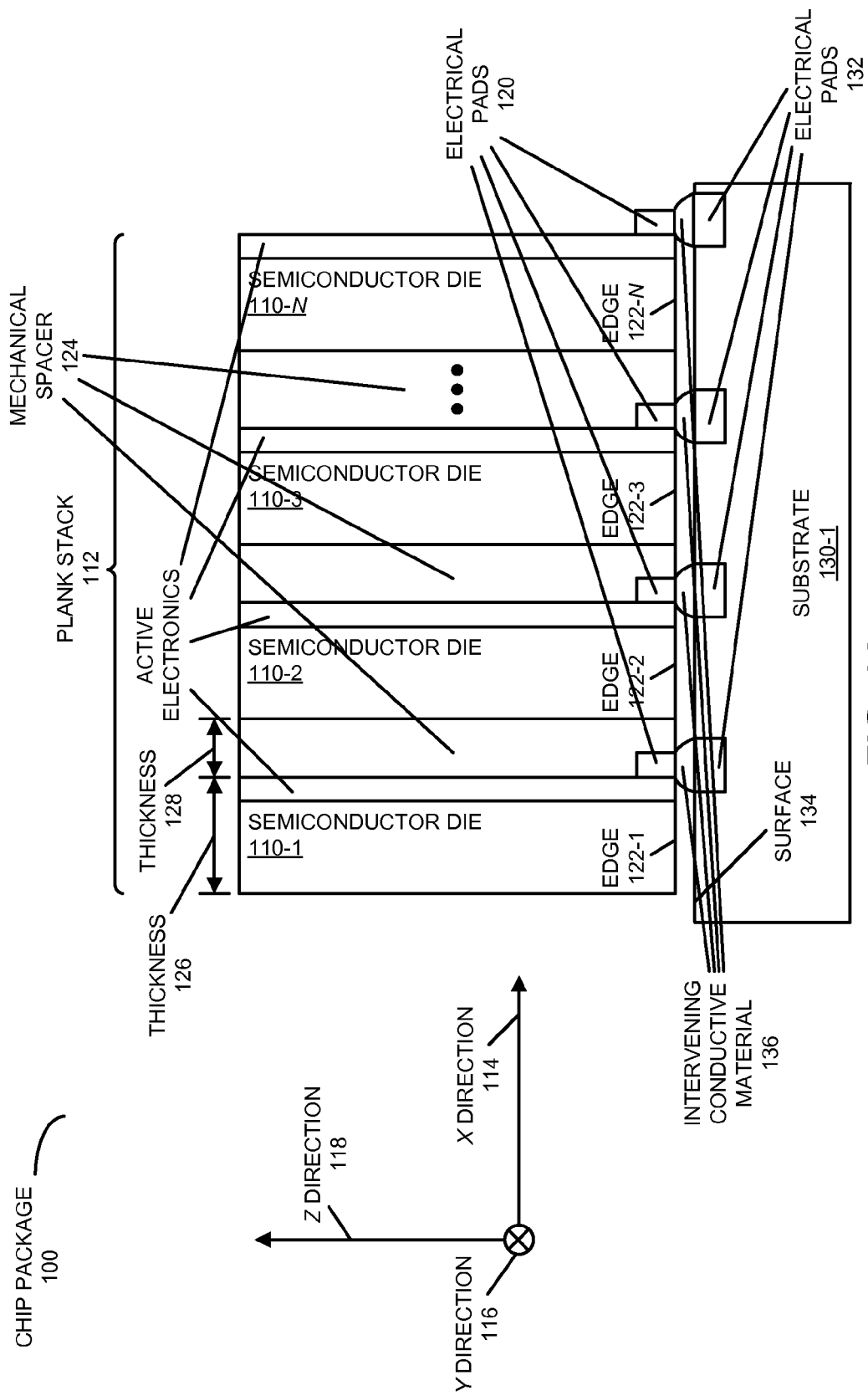
FIG. 1A is a block diagram illustrating a side view of a chip package in accordance with an embodiment of the present disclosure.

We now describe embodiments of the chip package. FIG. 1A presents a block diagram illustrating a side view of a chip package 100. This chip package includes a group of semiconductor dies 110 arranged in a plank stack 112 in an x direction 114 (which is sometimes referred to as a 'stacking direction'), where a plane of a given semiconductor die is defined by a y direction 116 (which is into the plane of FIG. 1A) and a z direction 118, and z direction 118, x direction 114 and y direction 116 are substantially perpendicular to each other. Note that semiconductor dies 110 include electrical pads 120 proximate to edges 122 of semiconductor dies 110, and edges 122 of semiconductor dies 110 define a face of plank stack 112. For example, electrical pads 120 may be deposited onto the active electronics. These pads can be implemented using either the semiconductor-die layout or by using a redistribution layer (RDL). In some embodiments, electrical pads 120 have a uniform inter-pad spacing. However, in other embodiments a non-uniform spacing is used.

Moreover, chip package 100 includes a mechanical spacer 124 between pairs of semiconductor dies (such as semiconductor dies 110-1 and 110-2) in group of semiconductor dies 110. For example, semiconductor dies 110 in plank stack 112 may be mechanically coupled to each other by adhesive layers, such as an epoxy or glue that cures in 10 s at 140 C. (Alternatively, mechanical spacer 124 may be air.) Furthermore, a given semiconductor die in the group of semiconductor dies 110 may have a nominal thickness, such as thickness 126 (which may be between 30 and 250 µm), and mechanical spacer 124 may have a nominal thickness, such as thickness 128 (which may be between 10 and 600 µm). However, note that in some embodiments the thickness of at least some of semiconductor dies 110 and/or mechanical spacer 124 in plank stack 112 may be different (for example, thicknesses of semiconductor dies 110 and/or mechanical spacer 124 may vary along x direction 114).

Chip package 100 also includes a substrate 130-1 (which is sometimes referred to as an 'interposer' or a 'semiconductor base chip') that may be rigidly mechanically and electrically coupled to semiconductor dies 110 along x direction 114 (i.e., to the face of plank stack 112), where a plane of substrate 130-1 is defined by x direction 114 and y direction 116. This electrical coupling to semiconductor dies 110 may be between electrical pads 120, electrical pads 132, which are proximate to a surface 134 of substrate 130-1, along x direction 114, and an intervening conductive material 136 between electrical pads 120 and 132. Note that the electrical coupling may facilitate input/output (I/O) communication with semiconductor dies 110 and/or supplying power to semiconductor dies 110. In some embodiments, chip package 100 facilitates simultaneous communication with each of a large number of semiconductor dies 110 while maintaining a small overall footprint.

Figure 1B:
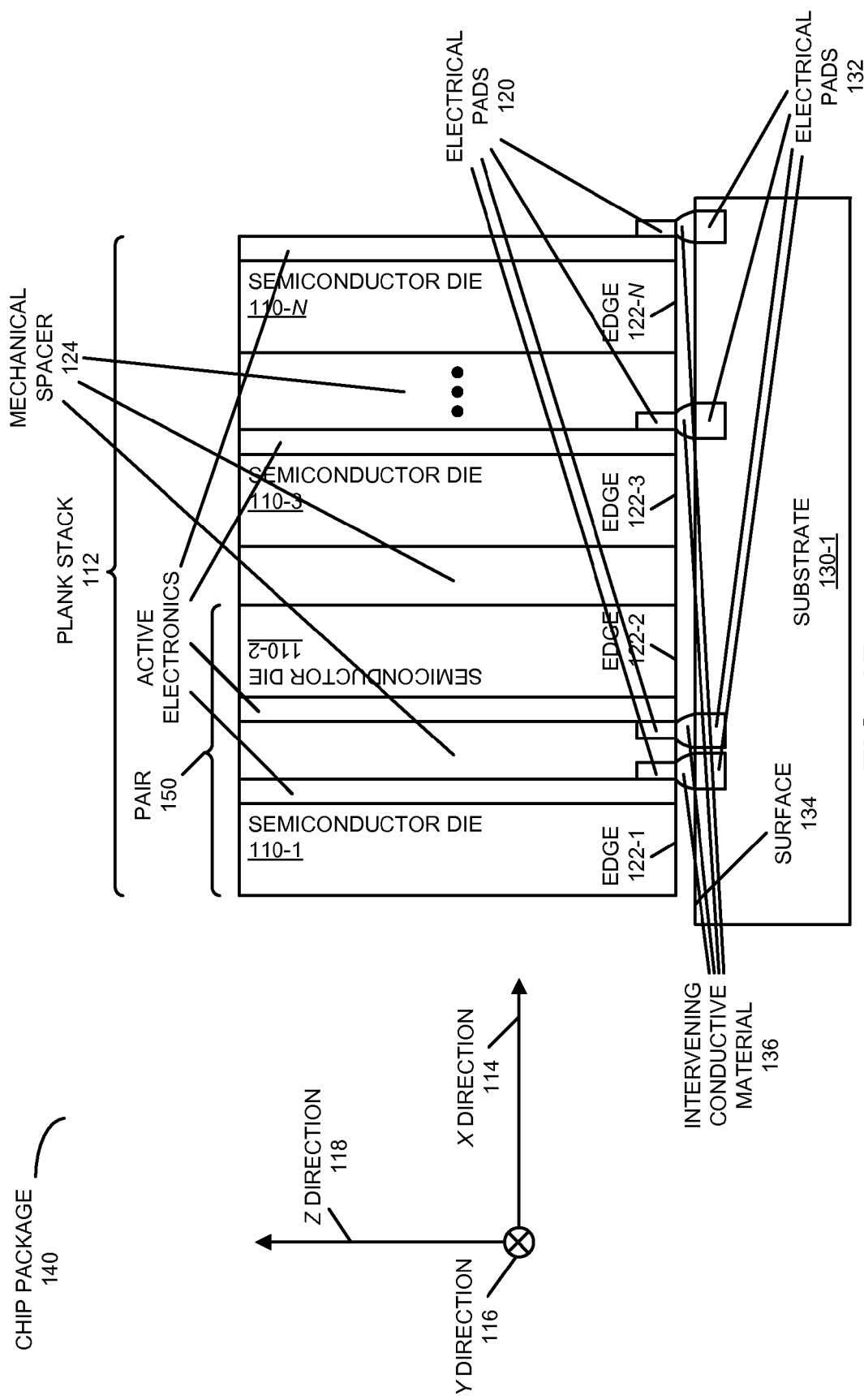
FIG. 1B is a block diagram illustrating a side view of a chip package in accordance with an embodiment of the present disclosure.

While FIG. 1A illustrates a chip module in which semiconductor dies 110 have a common orientation (so that active electronics proximate to surfaces of semiconductor dies 110 are on a common side of semiconductor dies 110), in other embodiments an alternating or periodic orientation is used (so that the active electronics proximate to surfaces of the pairs of adjacent semiconductor dies 110, such as pair 150, face each other). This is shown in FIG. 1B, which presents a block diagram illustrating a side view of a chip package 140.

Furthermore, while FIG. 1A illustrates electrical coupling between semiconductor dies 110 and substrate 130-1 along x direction 114, in some embodiments electrical pads 120 are also arranged along y direction 116 (i.e., electrical pads are arranged along an edge of semiconductor dies 110 in the plane of semiconductor dies 110) and electrical coupling between semiconductor dies 110 and substrate 130-1 also occurs along y direction 116 via intervening conductive material 136. In embodiments where semiconductor dies 110 are other than memory chips, the electrical pads 120 along y direction 116 for a given semiconductor die (such as semiconductor die 110-1) may be discrete or a continuous electrical signal line (such as a bus). Thus, the electrical coupling along y direction 116 may involve simultaneous one-to-one electrical connections or a bus. Similarly, the electrical coupling along x direction 114 may involve simultaneous one-to-one electrical connections or a bus.

Figure 1C:
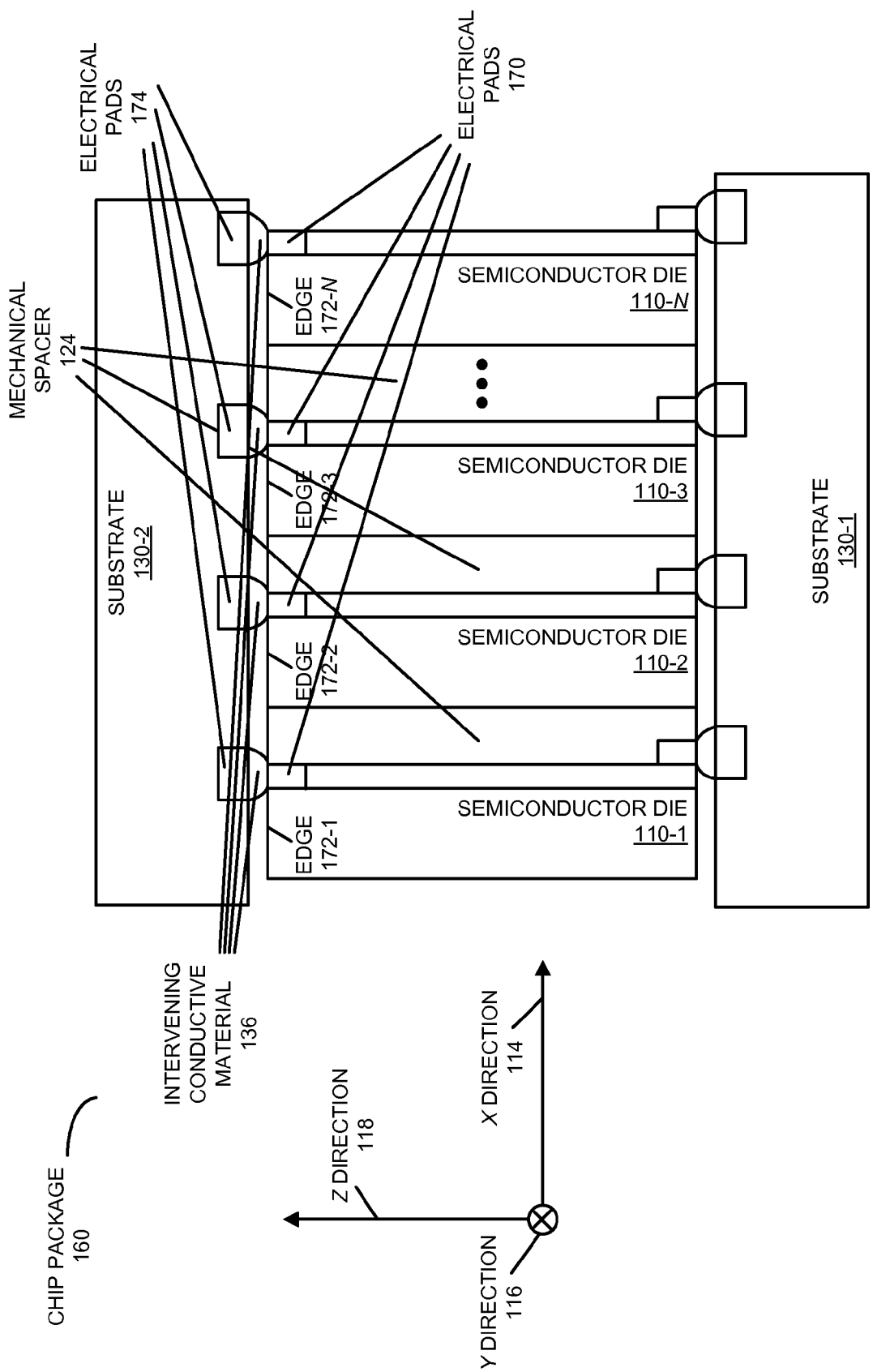
FIG. 1C is a block diagram illustrating a side view of a chip package in accordance with an embodiment of the present disclosure.

In some embodiments, more than one edge of a given semiconductor die can be used for pad placement and to interface to a substrate, which may allow more routing area and may improve the electrical performance of chip package 100. This is shown in FIG. 1C, which presents a block diagram illustrating a side view of a chip package 160. In particular, electrical pads 170 proximate to edges 172 (which define another face of plank stack 112) may be electrically coupled to electrical pads 174 on optional substrate 130-2 along x direction 114 or y direction 116 via intervening conductive material 136.

Figure 1D:
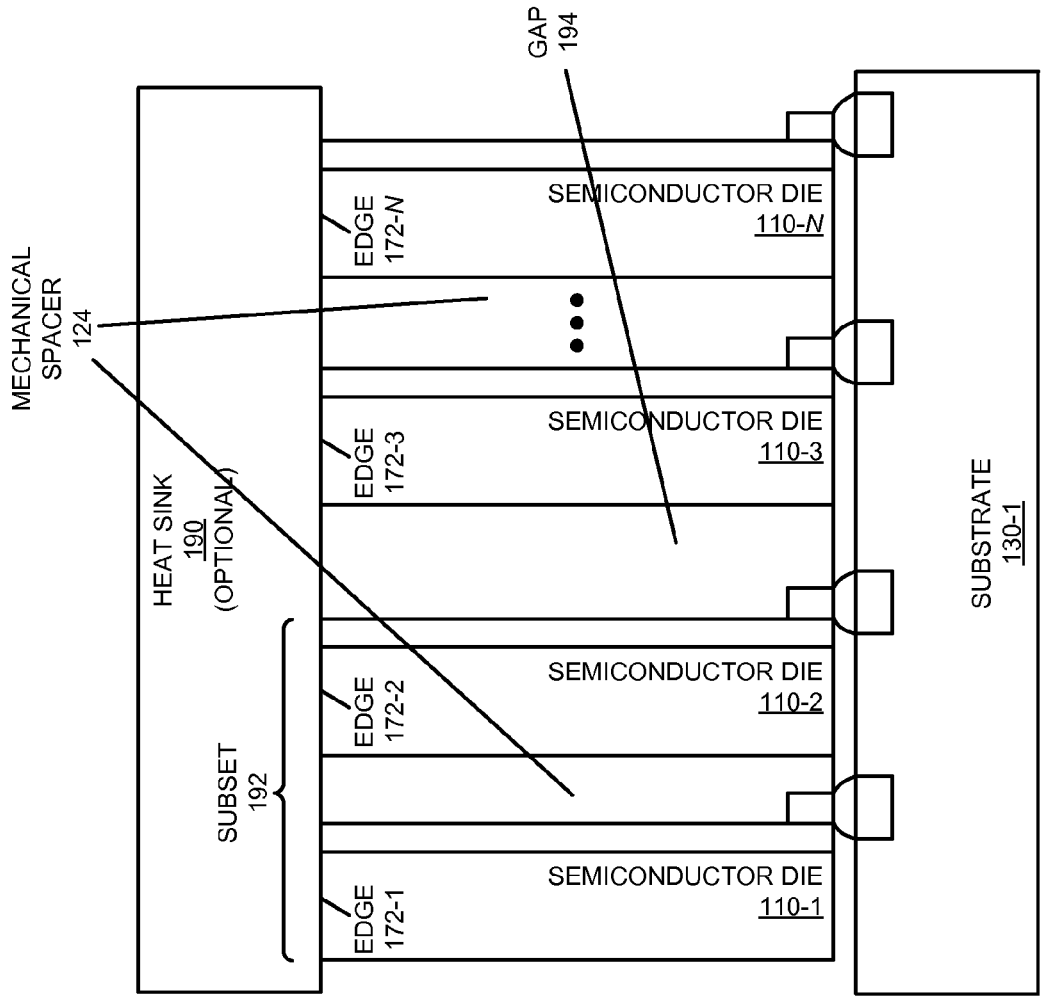
FIG. 1D is a block diagram illustrating a side view of a chip package in accordance with an embodiment of the present disclosure.
Figure 1D:
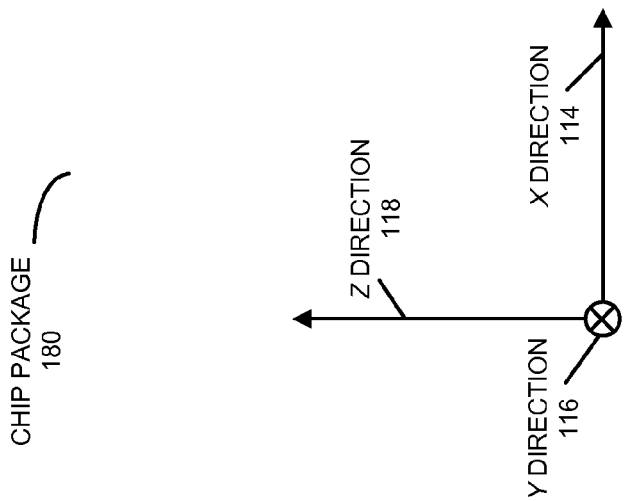

As shown in FIG. 1D, which presents a block diagram illustrating a side view of a chip package 180, the chip package may include one or more heat sinks (such as optional heat sink 190) thermally coupled to one or more other faces of plank stack 112, which are different than the face electrically coupled to substrate 130-1, thereby extracting heat from the one or more other faces of plank stack 112. For example, optional heat sink 190 may be placed on top of plank stack 112. Because of the approximately perpendicular orientation between semiconductor dies 110 and optional heat sink 190, a thermal path (and, thus, unobstructed heat flow) between these components may be maintained along x direction 114 so that the peak temperature in chip package 180 is independent of the number of semiconductor dies 110 in plank stack 112 (which is discussed further below with reference to FIG. 15). This capability may facilitate chip packages with more semiconductor dies 110 in plank stack 112 than chip packages that include TSVs.

In some embodiments, the group of semiconductor dies 110 may include at least two optional subsets of semiconductor dies (such as subset 192), which each include at least two semiconductor dies 110. These optional subsets of semiconductor dies (which are sometimes referred to as 'sub-stacks') may be combined to form the full plank stack 112. Furthermore, the optional subsets of semiconductor dies may be separated by a gap 194 along x direction 114. This gap may be used during the assembly process to improve the alignment accuracy and/or improve the alignment in chip package 180 even in the presence of thermal expansion. Additionally, testing/screening of the sub-stacks can be performed in order to improve the overall yield of chip package 180.

Referring back to FIG. 1A, in an exemplary embodiment substrate 130-1 includes: a semiconductor die (such as silicon), a ceramic, an organic material and/or glass. Moreover, intervening conductive material 136 may include: solder balls (as illustrated below with reference to FIG. 4), stacked solder balls, partially ground conductive material having a modified aspect ratio than that of un-ground conductive material (as illustrated below with reference to FIGS. 2A and 2B), stud bumps (as illustrated below with reference to FIGS. 2A, 2B and 3), plated traces (as illustrated below with reference to FIG. 5), wire bonds (as illustrated below with reference to FIGS. 7A and 7B), spring connectors that are electrically coupled to substrate 130-1 (as illustrated below with reference to FIGS. 13 and 14), traces defined using tape automated bonding or TAB (as illustrated below with reference to FIGS. 8 and 9), an anisotropic conductive material (such as an anisotropic elastomer film, which is sometimes referred to as an 'anisotropic conductive film') and/or a conductive adhesive.

Figure 2A:
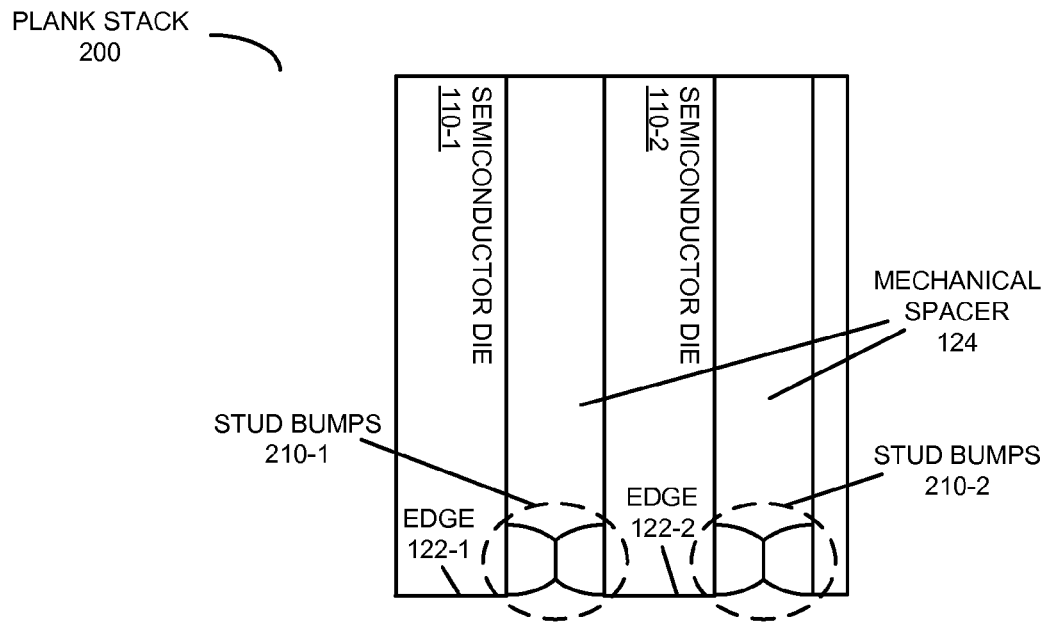
FIG. 2A is a block diagram illustrating a side view of a plank stack in the chip packages of FIGS. 1A-1D with two semiconductor dies and stud bumps in accordance with an embodiment of the present disclosure.

We now consider a series of embodiments that can be used to implement the chip package. First, options for stacking the semiconductor dies are considered. Case A is illustrated in FIG. 2A, which presents a block diagram illustrating a side view of a plank stack 200 in chip packages 100 (FIG. 1A), 140 (FIG. 1B), 160 (FIG. 1C) and/or 180 (FIG. 1D) with two semiconductor dies 110 and stud bumps 210 (before grinding). In this case, the RDL layer or a layout of semiconductor dies 110 is designed to bring bump pads (i.e., electrical pads 120 in FIGS. 1A-1D) as close as possible to edges 122 of semiconductor dies 110. Then, stud bumps 210 are placed on the bump pads. For example, gold stud bumps may be used (such as the two double stacked gold stud bumps shown in FIG. 2A). This may provide pads for soldering semiconductor dies 110 to substrate 130-1 (FIGS. 1A-1D). In addition, as described further below, it may provide controlled spacing between semiconductor dies 110 in the plank stack. In some embodiments, mechanical spacer 124 is an adhesive that glues together semiconductor dies 110 and encapsulates stud bumps 210. (Thus, mechanical spacer 124 may fill the spaces between the pairs of semiconductor dies 110 down to the bump pads.)

Figure 2B:
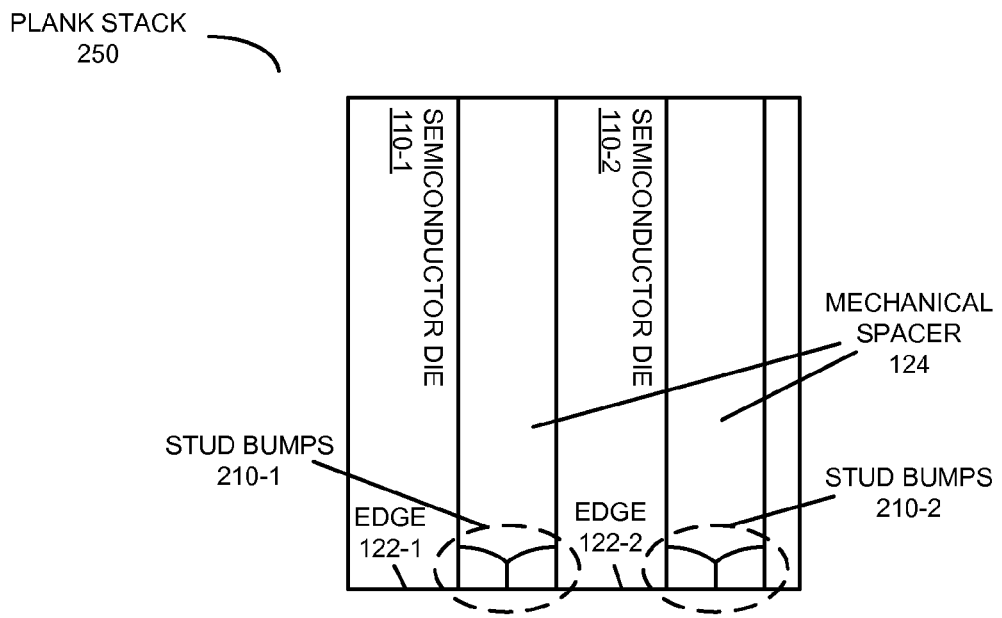
FIG. 2B is a block diagram illustrating a side view of a plank stack in the chip packages of FIGS. 1A-1D with two semiconductor dies and stud bumps after grinding in accordance with an embodiment of the present disclosure.

The size, aspect ratio and the number of stud bumps 210 can be optimized for a desired bump-pad size and bump-pad shape. Moreover, stud bumps 210 can be ground and/or polished to modify the aspect ratio and to form pads for soldering to substrate 130-1 (FIGS. 1A-1D). This is shown in FIG. 2B, which presents a block diagram illustrating a side view of plank stack 250.

Figure 3:
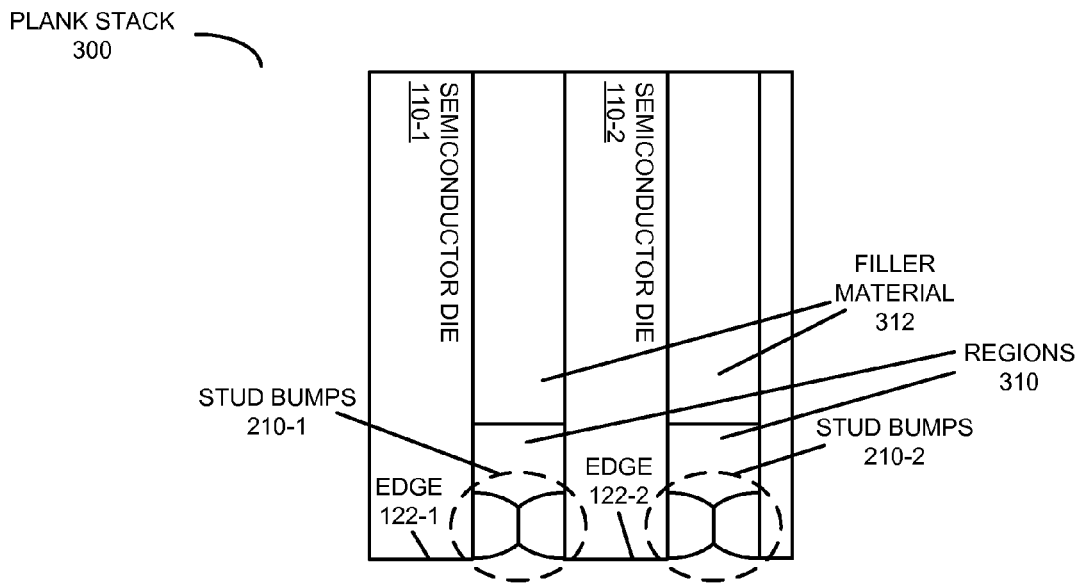
FIG. 3 is a block diagram illustrating a side view of a plank stack in the chip packages of FIGS. 1A-1D with two semiconductor dies and an adhesive recessed from the stud bumps in accordance with an embodiment of the present disclosure.

In Case B, the RDL layer or a layout of the semiconductor dies is designed to bring bump pads as close as possible to the edges of semiconductor dies. Then, the semiconductor dies are stacked and glued together. However, in this case, the mechanical spacer, such as filler material 312, may be recessed from the area with the stud bumps, which leaves recessed regions 310 without filler material 312. This is shown in FIG. 3, which presents a block diagram illustrating a side view of a plank stack 300 in chip packages 100 (FIG. 1A), 140 (FIG. 1B), 160 (FIG. 1C) and/or 180 (FIG. 1D).

Note that cases A and B can be implemented by either of two approaches. In the first, the semiconductor dies are stud bumped at the wafer level. Then, the semiconductor dies are diced through the stud bumps or diced as close as possible to the stud bumps. If needed, there may be subsequent polishing. In the second approach, the wafer is diced before stud bumping. This dicing may be as close as possible to the bump pads or may be through the bump pads.

Moreover, note that embodiments which involve soldering to gold stud bumps may involve additional processing operations to add barrier layers to prevent intermetallic formation. In particular, additional barrier layers, such as nickel/gold or nickel/palladium/gold metal stacks, may be deposited on the entire stud-bump surface using an electroless plating technique at either the wafer or die level. Similarly, embodiments that involve dicing through the stud bumps and/or bump pads may include processing operations to protect the bumps pads, such as depositing the additional barrier layers on the entire stud-bump surfaces.

Figure 4:
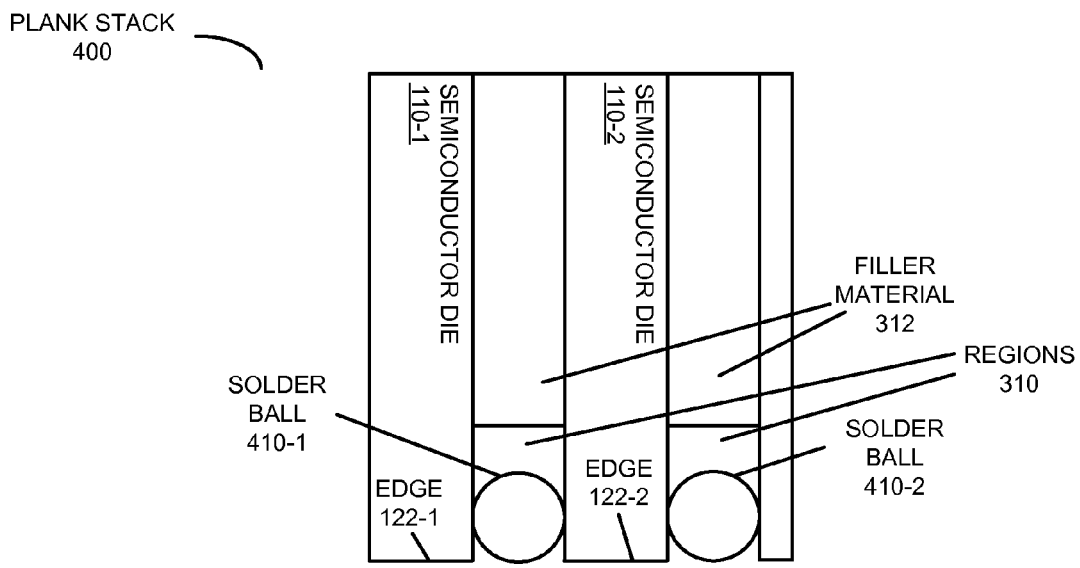
FIG. 4 is a block diagram illustrating a side view of a plank stack in the chip packages of FIGS. 1A-1D with two semiconductor dies and solder balls in accordance with an embodiment of the present disclosure.

In Case C, the operations in Case B are performed with the stud bumps replaced with solder balls, copper pillars, thick-plated pads or a similar type of conductive 3D feature. This is illustrated in FIG. 4, which presents a block diagram illustrating a side view of a plank stack 400 in chip packages 100 (FIG. 1A), 140 (FIG. 1B), 160 (FIG. 1C) and/or 180 (FIG. 1D) with two semiconductor dies 110 and solder balls 410. As with the stud bumps, in some embodiments solder balls 410 can be ground. Moreover, the number and size of solder balls 410 can be changed to determine the aspect ratio.

In Case D, similar operations to Case A or Case B may be performed with the bump pads for the RDL placed inside the saw lane. These bump pads may either be plated with a thick metal layer or a conductive 3D feature (such as a gold stud bump, a solder ball, a copper pillar, etc.) may be added to increase the contact area presented to substrate 130-1 (FIGS. 1A-1D).

Figure 5:
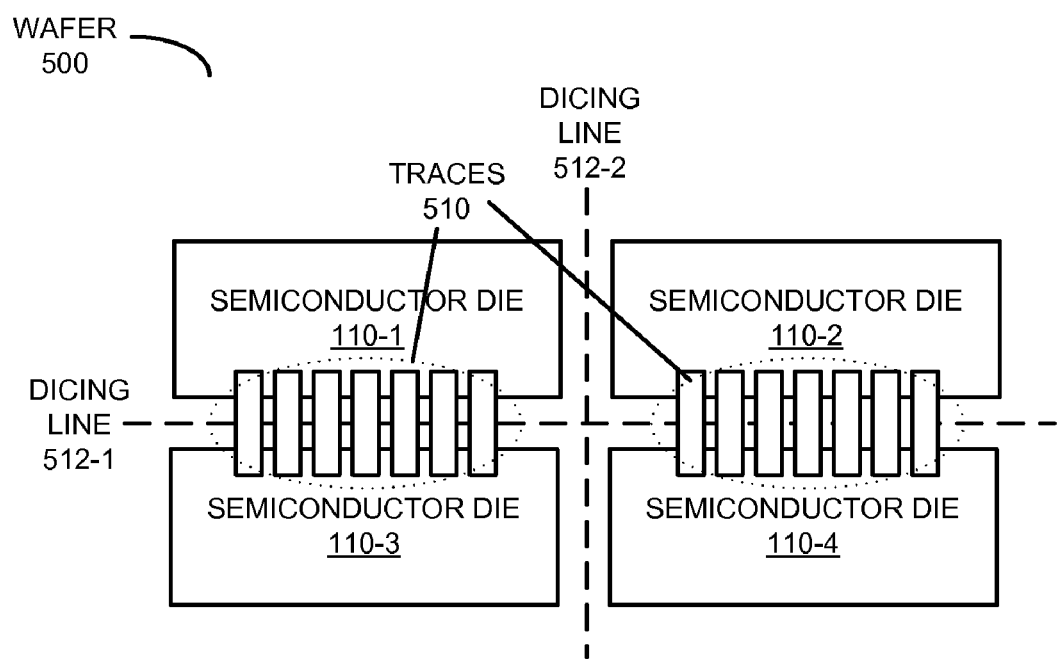
FIG. 5 is a block diagram illustrating a top view of a wafer with semiconductor dies coupled by plated traces in accordance with an embodiment of the present disclosure.
Figure 6A:
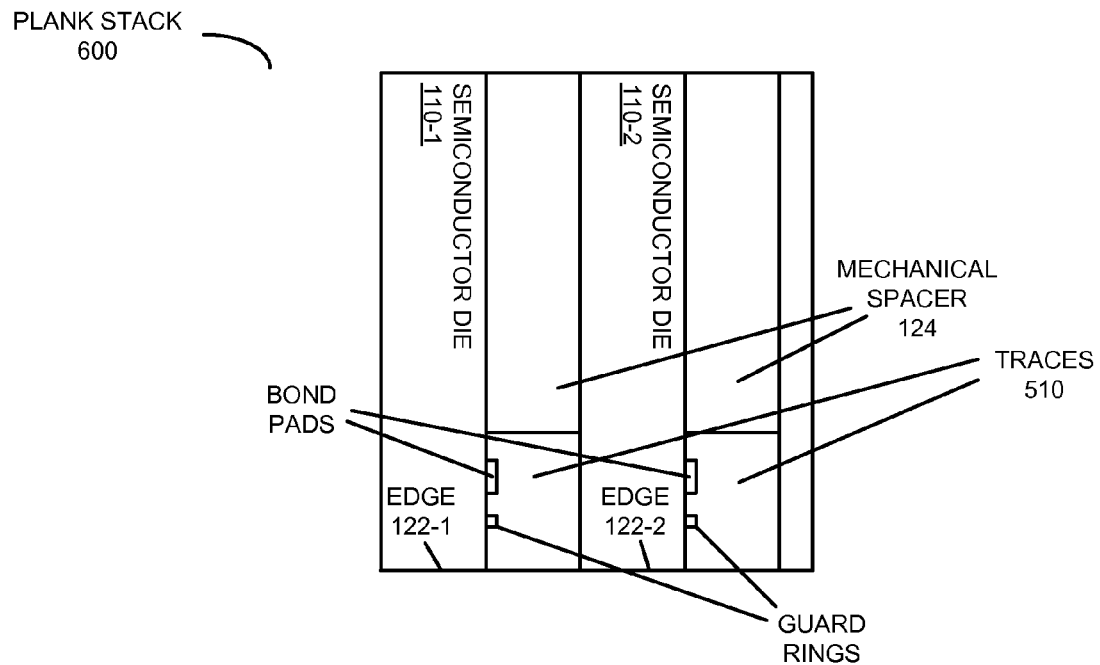
FIG. 6A is a block diagram illustrating a side view of a plank stack in the chip packages of FIGS. 1A-1D in accordance with an embodiment of the present disclosure.
Figure 6B:
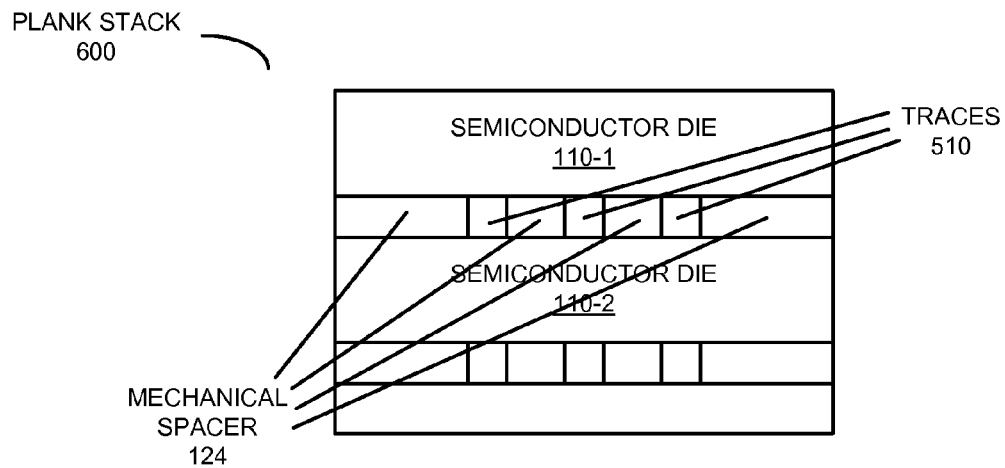
FIG. 6B is a block diagram illustrating a bottom view of the plank stack in FIG. 6A in accordance with an embodiment of the present disclosure.

As shown in FIG. 5, in Case E bond pads on adjacent semiconductor dies 110 on a wafer 500 are coupled by plated traces 510 across dicing lanes 512. (Thus, in some embodiments intervening conductive material 136 in FIGS. 1A-1D extends beyond a guard ring associated with the given semiconductor die so that intervening conductive material 136 in FIG. 1A extends into the street on wafer 500.) The plating can be performed using gold, copper (if finished with nickel/gold) or solder. Moreover, the plating thickness may be between 40 and 60 µm. Subsequently, an adhesive layer (and, more generally, the mechanical spacer) may be added to encapsulate plated traces 510. Next, wafer 500 may be diced and polished to expose the edges of plated traces 510. This is shown in FIG. 6A, which presents a block diagram illustrating a side view of a plank stack 600 in chip packages 100 (FIG. 1A), 140 (FIG. 1B), 160 (FIG. 1C) and/or 180 (FIG. 1D). FIG. 6B presents a block diagram illustrating a bottom view of plank stack 600.

Figure 7A:
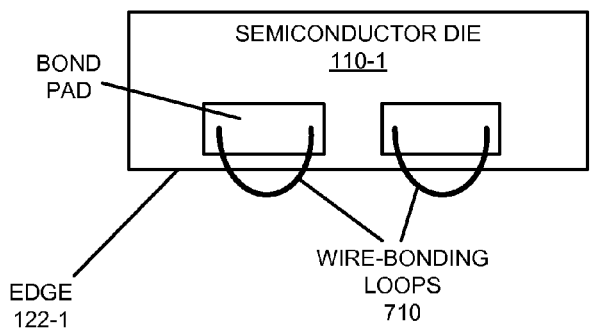
FIG. 7A is a block diagram illustrating a front view of a semiconductor die in the chip packages of FIGS. 1A-1D with wire-bonding loops in accordance with an embodiment of the present disclosure.
Figure 7B:
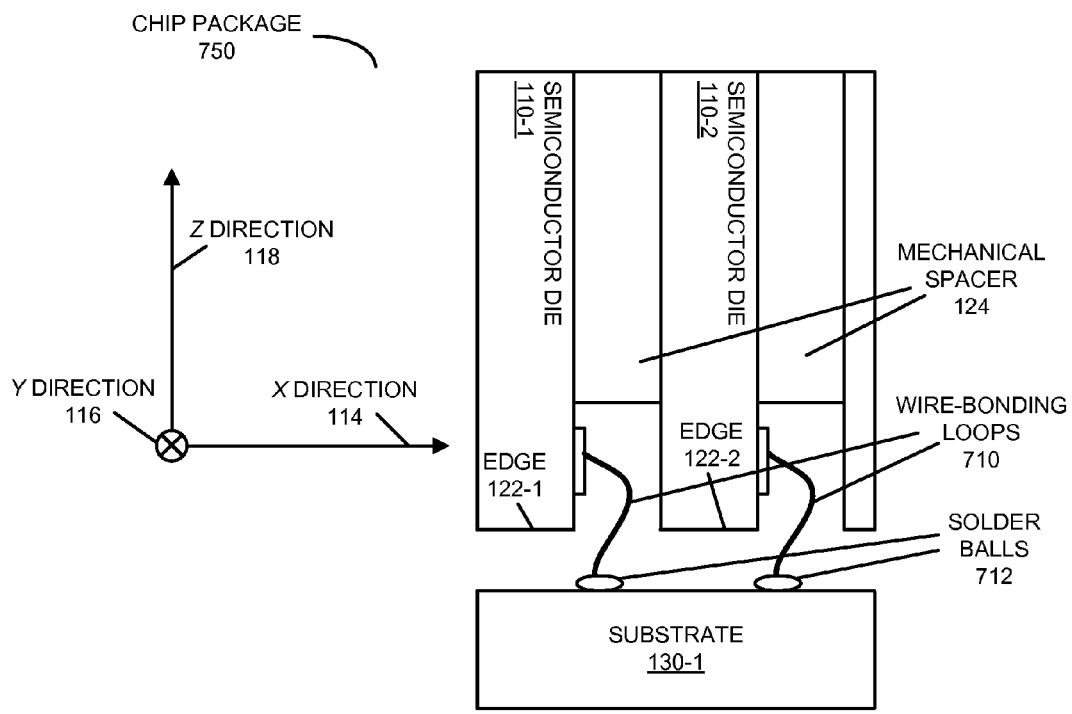
FIG. 7B is a block diagram illustrating a side view of a chip package that includes the semiconductor die in FIG. 7A in accordance with an embodiment of the present disclosure.

In Case F, wire bonds are placed on the bond pads of the semiconductor dies with a section of a wire (or a loop) bent toward the edges of the semiconductor dies. In particular, a section of gold/copper wire (between 50 and 140 µm long) overhangs the edge during the wire-bonding looping process. As shown in FIG. 7A, which presents a block diagram illustrating a front view of semiconductor die 110-1 in chip packages 100 (FIG. 1A), 140 (FIG. 1B), 160 (FIG. 1C) and/or 180 (FIG. 1D), wire-bonding loops 710 form segments which overhang edge 122-1 of semiconductor die 110-1. A given loop starts from a first stud bump on a given bond pad and ends on the same bond pad with a second stud bump. Then, an adhesive layer (and, more generally, the mechanical spacer) is added either to encapsulate the wire bonds/ribbon bonds (as in Case A) or is recessed from that area (as in Case B). Moreover, the semiconductor dies are stacked in the plank stack. Note that stud bumps or another technique described below may be used to maintain the desired spacing between the semiconductor dies in the plank stack. Next, as shown in FIG. 7B, which presents a block diagram illustrating a side view of a chip package 750, the sections of wire-bonding loops 710 which overhang edges 122 of semiconductor dies 110 may be bent toward the out-of-plane direction, i.e., x direction 114 (for example, with an angle between 45 and 90°), and are connected to solder balls 712 on substrate 130-1.

In Case G, bond pads on the semiconductor dies are either as close to the saw or dicing lane as possible or extend to the saw lane. Then, the wafer is diced, and the semiconductor dies are stacked into the plank stack. Note that stud bumps or another technique described below may be used to maintain the desired spacing between the semiconductor dies in the plank stack. Moreover, the adhesive layer (and, more generally, the mechanical spacer) may be recessed from the area with the bond pads. Furthermore, contact between the semiconductor dies and the substrate may be established using one of the stack-to-substrate assembly techniques described below. However, the contact may be to the face of the bond pad instead of the bond-pad edge.

Figure 8:
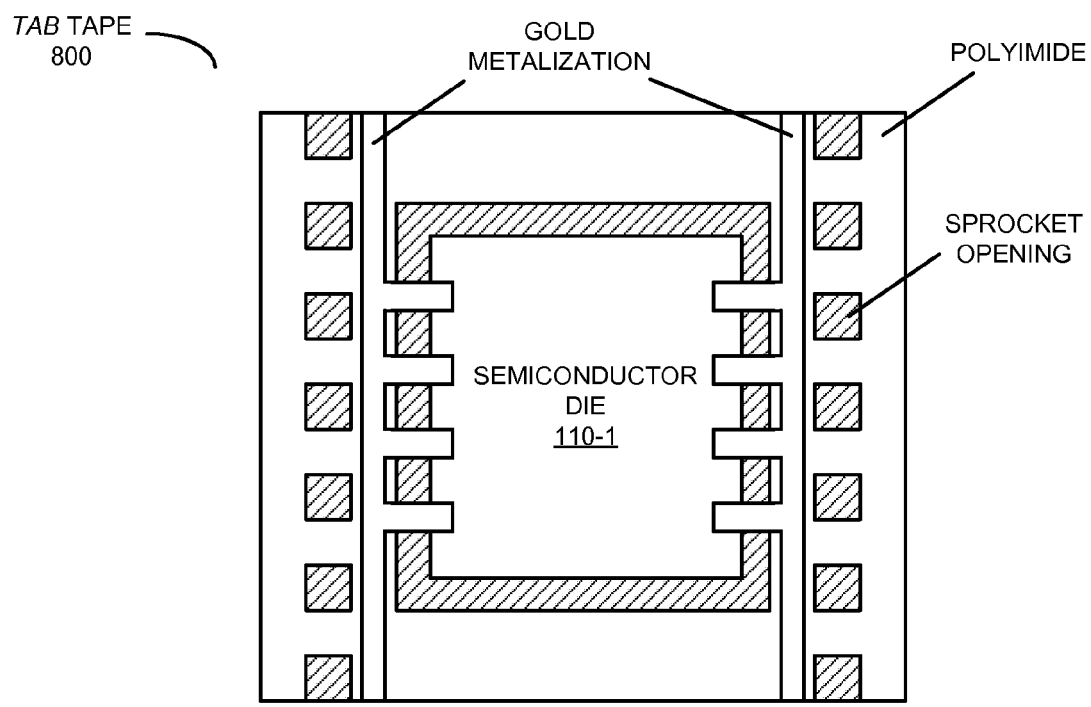
FIG. 8 is a block diagram illustrating a top view of a semiconductor die on a reel of tape-automated-bonding tape in accordance with an embodiment of the present disclosure.

In Case H, TAB technology is used. This is illustrated in FIG. 8, which presents a block diagram illustrating a top view of a semiconductor die 110-1 on a reel of TAB tape 800 following a thermocompression bonding of patterned gold traces on polyimide to semiconductor die 110-1. Note that the tape may be sprocketed to assist in automated handling of the semiconductor dies.

Figure 9:
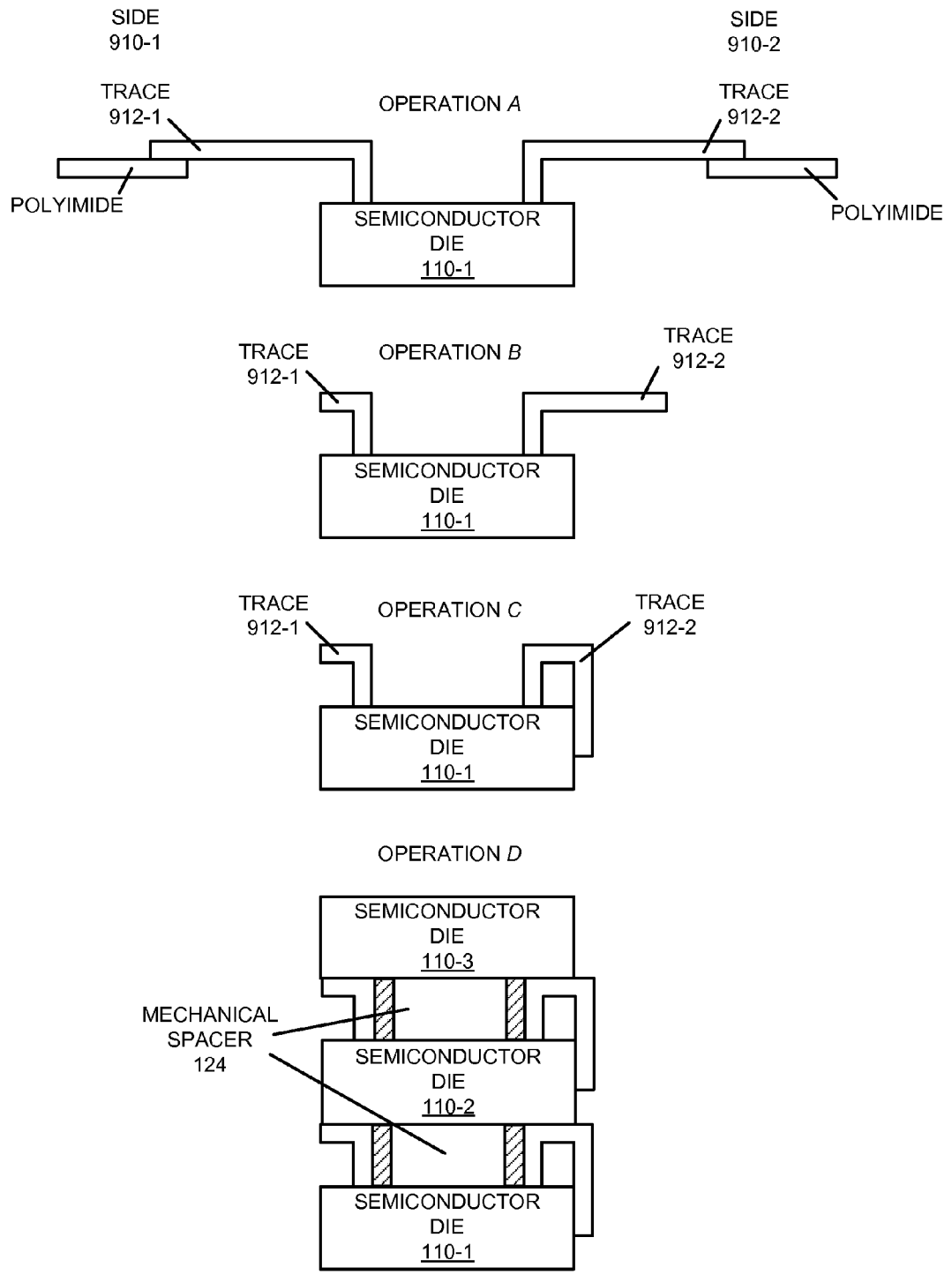
FIG. 9 is a block diagram illustrating a side view of operations during assembly of a plank stack in the chip packages of FIGS. 1A-1D in accordance with an embodiment of the present disclosure.

Assembly of the plank stack using TAB technology is illustrated in FIG. 9 by operations A-D. In particular, metal traces 912 may be cut. On side 910-2, the cut traces may extend beyond semiconductor die 110-1 for coupling to the substrate (for example, when cut on one end, the excess trace may be a beam that can be folded around the side of semiconductor die 110-1 to bond to the substrate). Moreover, trace 912-1 on side 910-1 of semiconductor die 110-1 may function as a spacer (i.e., non-conductive purposes) to provide a controlled spacing between the semiconductor dies 110 in the plank stack. For example, on side 910-1 trace 912-1 may be cut near to the edge of semiconductor die 110-1.

Then, traces 912 may be bent to contact the edge of semiconductor die 110-1, and semiconductor dies 110 may be adhesively bonded to form the plank stack. Note that contact between semiconductor dies 110 in the plank stack and the substrate may be established using intervening conducting material 136 (FIGS. 1A-1D), which is described further below in the discussion of stack-to-substrate assembly techniques.

Alternatively, a TAB tape section may be fabricated with the metallization pattern on the right-hand quadrant of the TAB tape. It may be thermocompression bonded to the semiconductor dies 110 using a separate pick and place operation for each semiconductor die. Then, the TAB tape may be singulated from the semiconductor dies 110 using a cutting operation, similar to that described above.

Figure 10A:
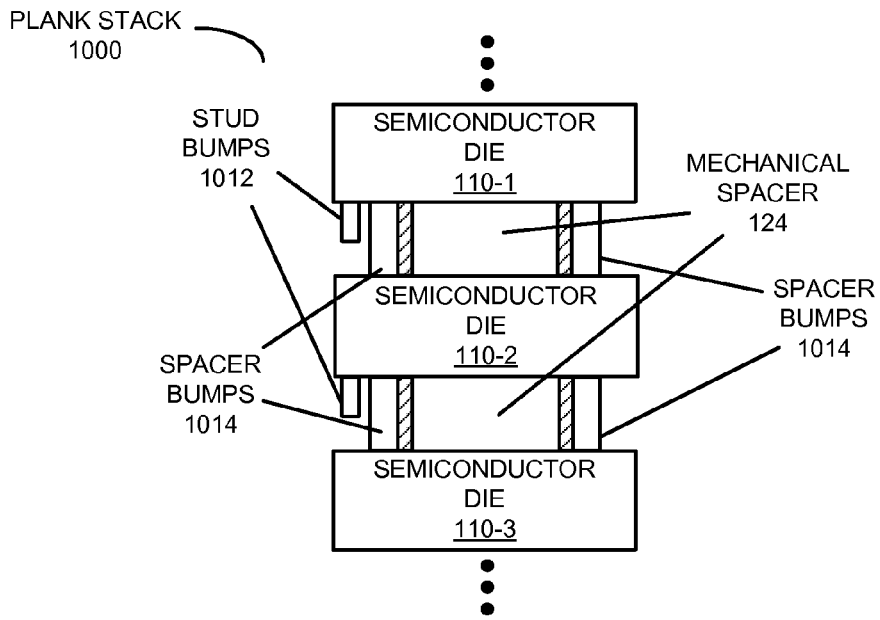
FIG. 10A is a block diagram illustrating a side view of a plank stack in the chip packages of FIGS. 1A-1D in accordance with an embodiment of the present disclosure.

We now consider options for controlling the spacing of the semiconductor dies in the plank stack. Spacing between the semiconductor dies in the plank stack may need to be controlled to ensure reliable electrical coupling to the substrate. As shown in FIG. 10A, which presents a block diagram illustrating a side view of a plank stack 1000 in chip packages 100 (FIG. 1A), 140 (FIG. 1B), 160 (FIG. 1C) and/or 180 (FIG. 1D), controlled spacing between semiconductor dies 110 can be achieved using gold stud bumps 1012. These stud bumps can provide the electrical coupling between semiconductor dies 110 and the substrate. In addition, stud bumps 1012 can provide controlled spacing between semiconductor dies 110 in plank stack 1000. Note that the same stud bumps can be used for both purposes, in which case the back side of semiconductor dies 110 may need to be passivated.

Alternatively, dedicated stud bumps, referred to as spacer bumps 1014 in FIG. 10A, may be used to provide controlled spacing only. These spacer bumps may be wider and taller than stud bumps 1012, which in these embodiments may be used for purposes of electrical coupling only. Note that a maximum stud-bump height may depend on the bump-pad diameter. However, in some embodiments different bump-pad sizes are used for spacer bumps 1014 and stud bumps 1012. In general, a large number of smaller bump pads can be used with stud bumps 1012 to provide a high-interconnect density, and a smaller number of large bump pads can be used for spacer bumps 1014.

Figure 10B:
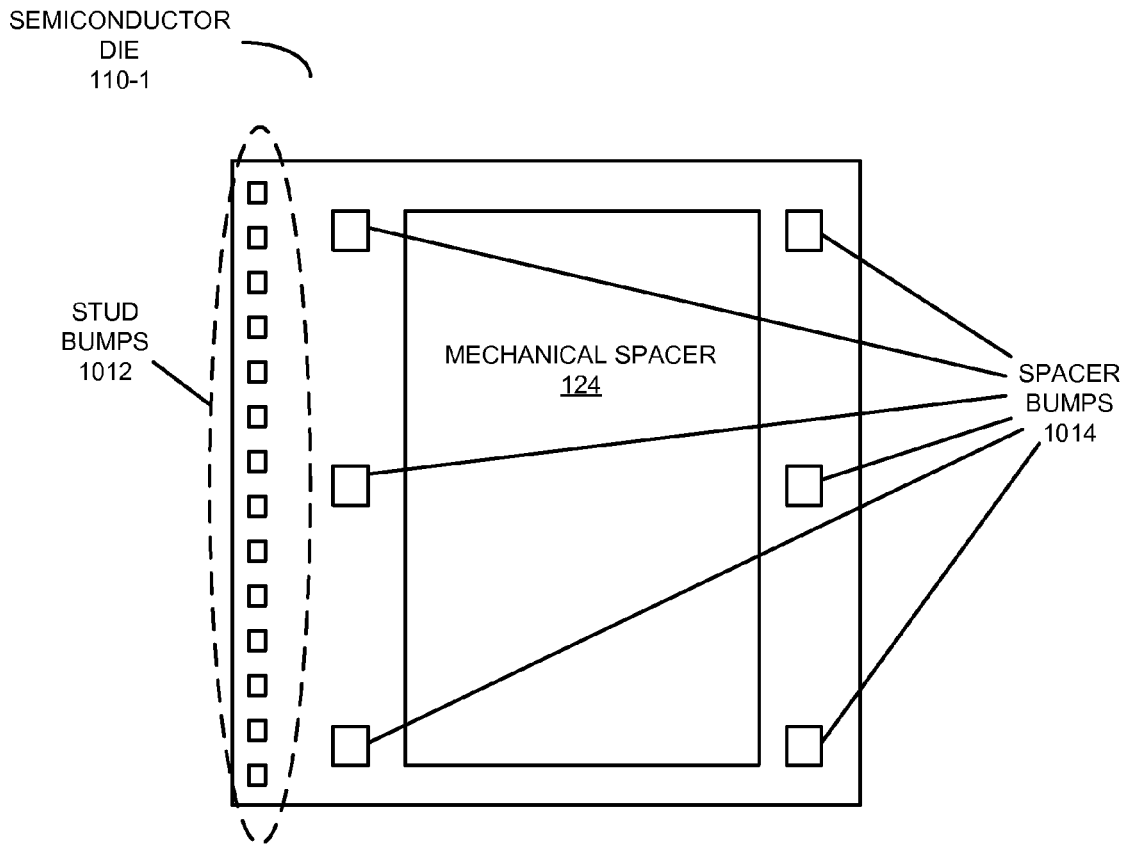
FIG. 10B is a block diagram illustrating a top view of a semiconductor die in the plank stack of FIG. 10A in accordance with an embodiment of the present disclosure.

A top view of semiconductor die 110-1 is shown in FIG. 10B. Note that stud bumps 1012 may be located near the edge of semiconductor die 110-1. Moreover, mechanical spacer 124 (which covers a portion of semiconductor die 110-1) may be used to keep semiconductor dies 110 (FIG. 10A) in plank stack 1000 (FIG. 10A) together.

Figure 11A:
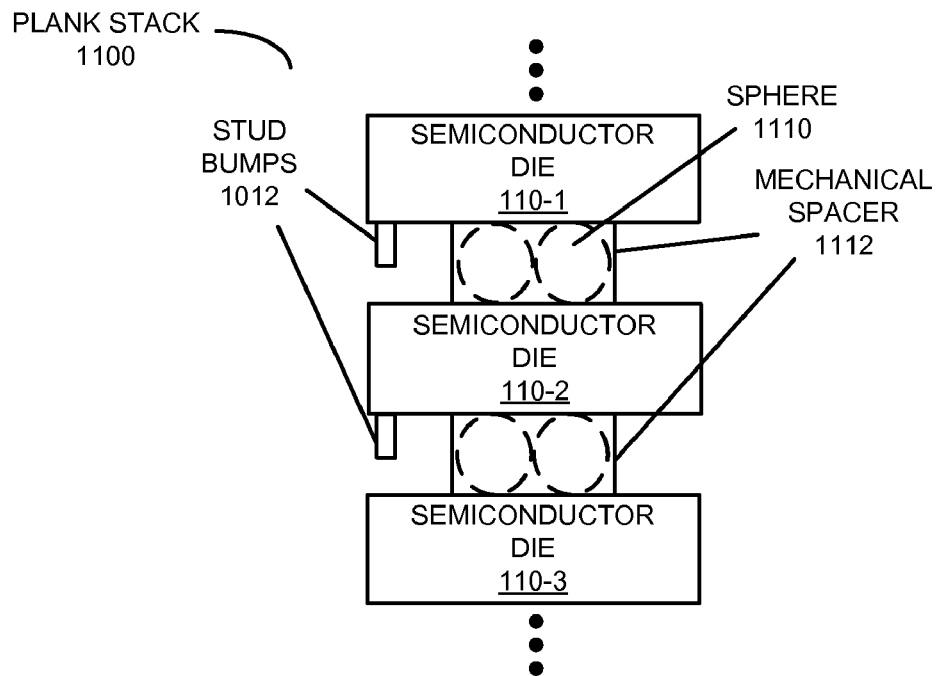
FIG. 11A is a block diagram illustrating a side view of a plank stack in the chip packages of FIGS. 1A-1D in accordance with an embodiment of the present disclosure.
Figure 11B:
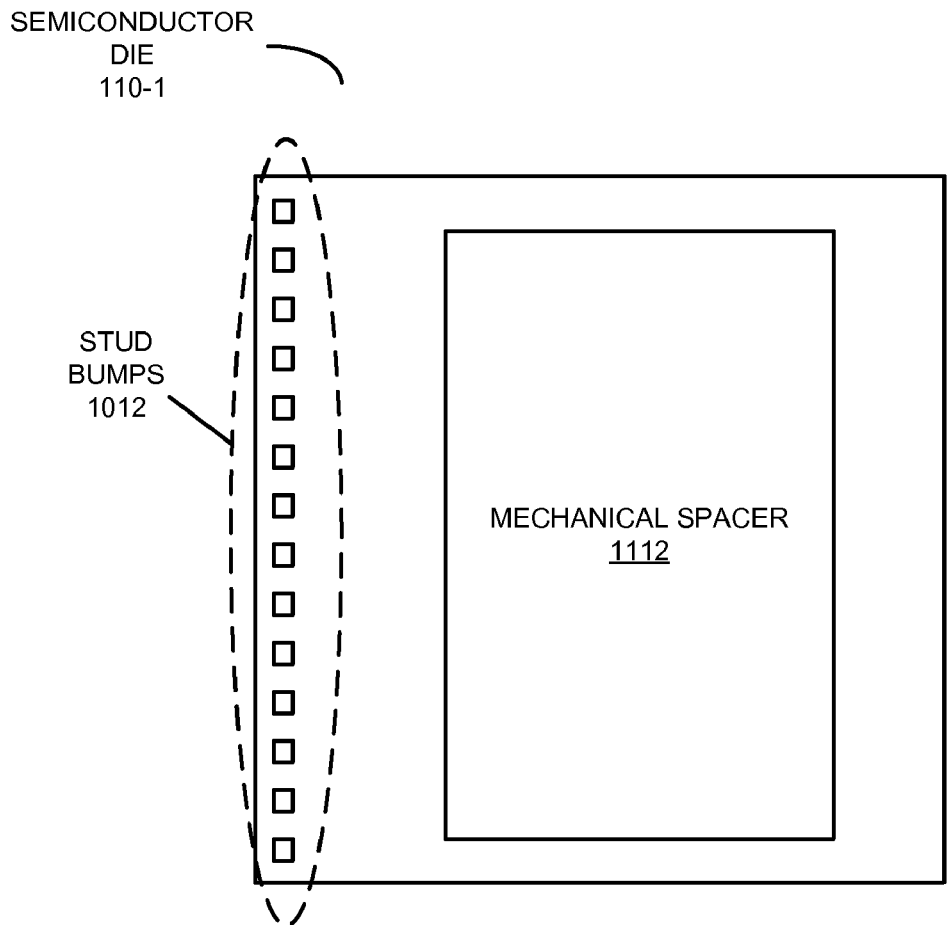
FIG. 11B is a block diagram illustrating a top view of a semiconductor die in the plank stack of FIG. 11A in accordance with an embodiment of the present disclosure.

As illustrated in FIG. 11A, which presents a block diagram illustrating a side view of a plank stack 1100 in chip packages 100 (FIG. 1A), 140 (FIG. 1B), 160 (FIG. 1C) and/or 180 (FIG. 1D), another technique for controlling the spacing involves adding spheres (such as sphere 1110) with a pre-defined diameter into mechanical spacer 1112. A top view of semiconductor die 110-1 in plank stack 1100 (FIG. 11A) is shown in FIG. 11B.

In order to provide a hard stop during bonding and to control the bondline thickness, a specially designed fixture with a staircase-shaped or stepped-terrace block can be used during assembly of the plank stack. Note that, in order to avoid accumulation of the on-plane misalignment, an upwards facing semiconductor die with fiducials or optical alignment markers for semiconductor-die placement may be placed next to the plank stack and used as a reference.

During assembly, semiconductor dies may be stacked with adhesive between them or with the adhesive and the stud bumps. Given a bondline-thickness target, the fixture may be used to compress the semiconductor dies to the required thickness of the full plank stack. A similar technique may be used to stack several sub-stacks into a full plank stack.

In particular, a flip-chip bonder may be used to measure the thickness of the plank stack relative to a reference plane with high accuracy. The result may be compared with a target height, and the bonding force may be adjusted accordingly. This technique may reduce the accumulation of errors in the plank-stack height and may compensate for the tolerances in the semiconductor-die thicknesses and/or the stud-bump heights. Note that a certain amount of compliance in the material/features between the semiconductor dies may be needed. For example, if stud bumps are used, the stud bumps may be either uncoined or only partially coined. This may allow the stud bumps to be compressed to a desired height.

Figure 12B:
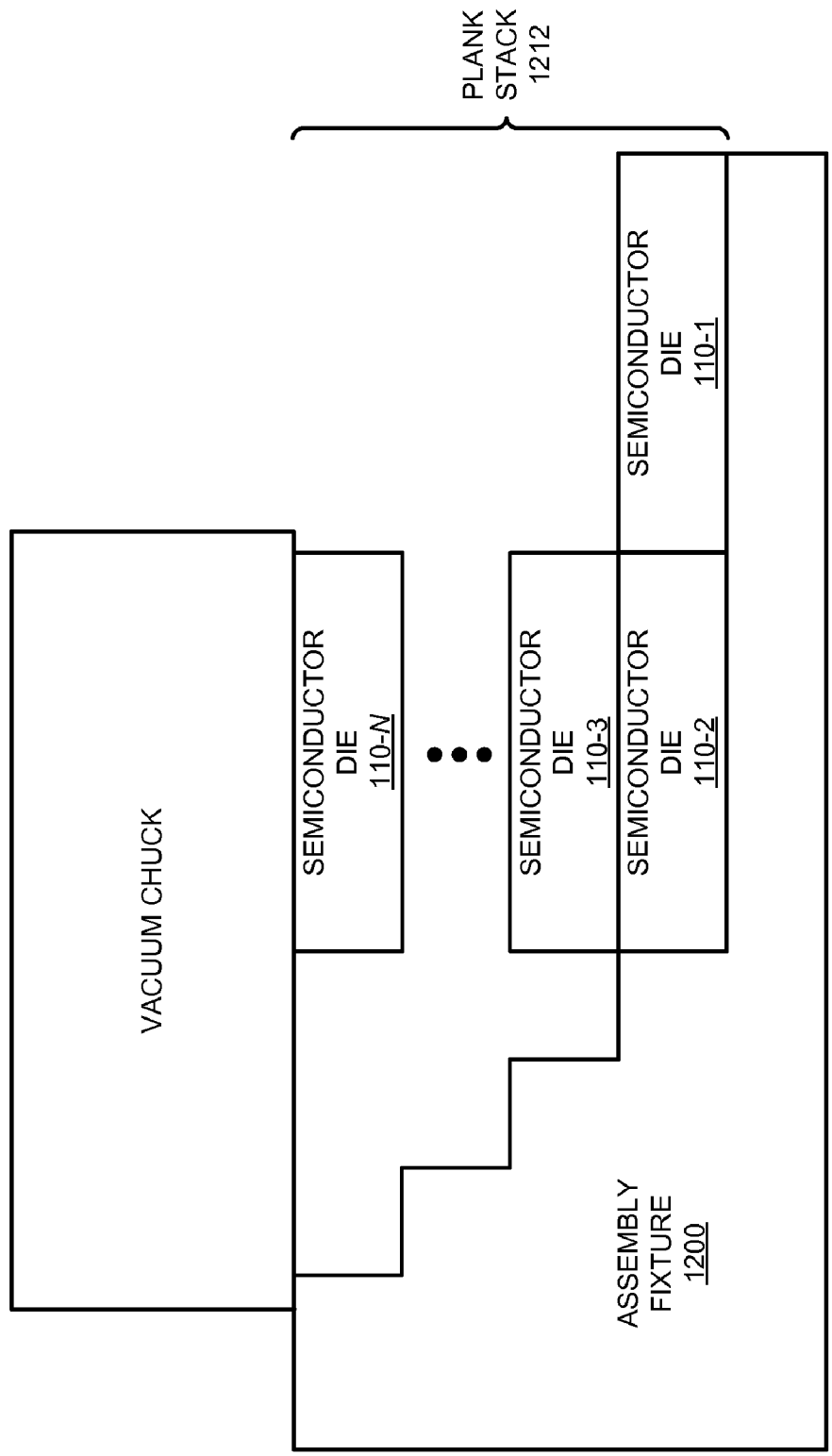
FIG. 12B is a block diagram illustrating assembly of the plank stack in the chip packages of FIGS. 1A-1D using the assembly fixture of FIG. 12A in accordance with an embodiment of the present disclosure.

This assembly technique is illustrated in FIG. 12A, which presents a block diagram illustrating assembly of a plank stack 1210 in chip packages 100 (FIG. 1A), 140 (FIG. 1B), 160 (FIG. 1C) and/or 180 (FIG. 1D) using an assembly fixture 1200. In particular, a first semiconductor die 110-1 (with the fiducials) may be placed face up and a second semiconductor die 110-2 may be placed face down. Moreover, stud bumps (not shown), which are used as an illustration, may be shorter than the bondline thickness. FIG. 12B presents a block diagram illustrating assembly of a full plank stack 1212 in chip packages 100 (FIG. 1A), 140 (FIG. 1B), 160 (FIG. 1C) and/or 180 (FIG. 1D) using assembly fixture 1200.

Referring back to FIG. 1A, thus, accumulated position errors over the group of semiconductor dies 110 in x direction 114 (i.e., an accumulated position error in positions of semiconductor dies 110 over plank stack 112) may be less than a sum of the position errors associated with the group of semiconductor dies 110 and mechanical spacer 124 between semiconductor dies 110. For example, the accumulated position error may be associated with thickness variation of the semiconductor dies 110 and/or thickness variation of mechanical spacer 124. In some embodiments, the accumulated position error may be less than 1 µm, and may be as small as 0 µm. Additionally, the group of semiconductor dies 110 may have a maximum position error in the plane of semiconductor dies 110 that is associated with edge variation of semiconductor dies 110 (such as a variation in the saw-line position), that is less than a predefined value (for example, the maximum position error may be less than 1 µm, and may be as small as 0 µm).

Figure 13:
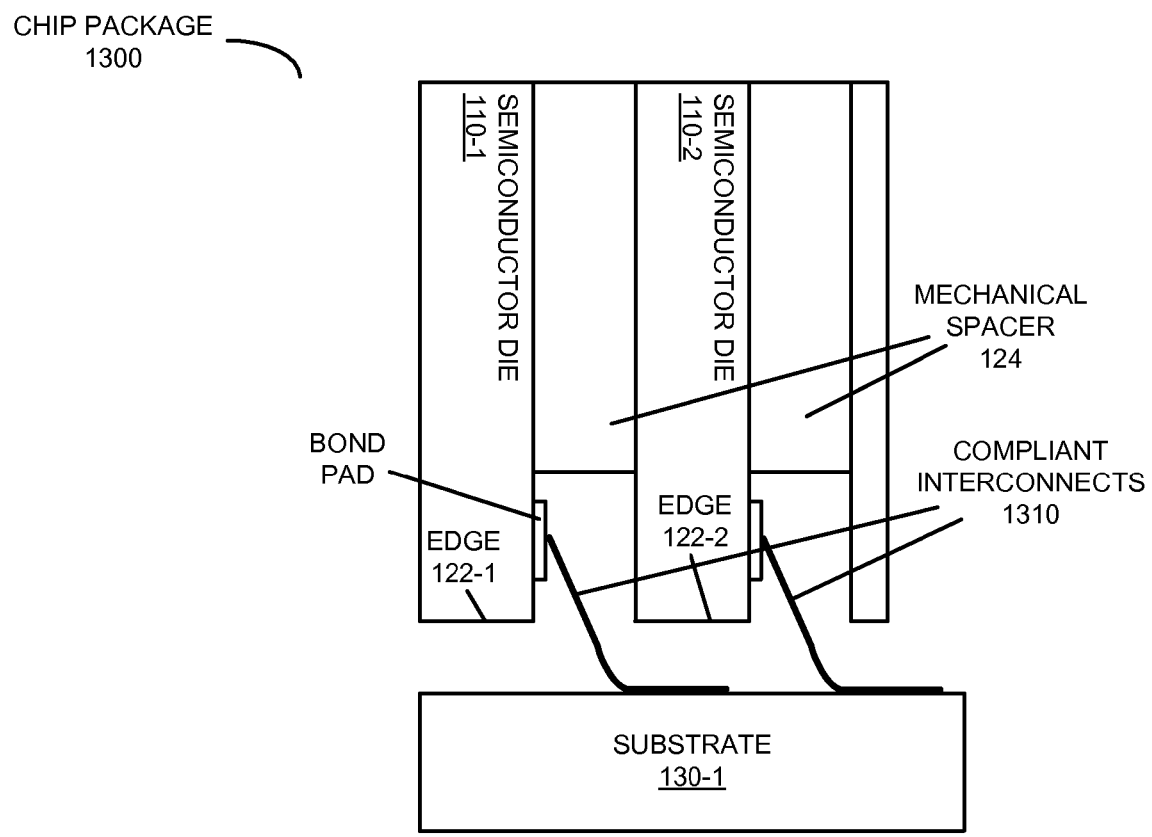
FIG. 13 is a block diagram illustrating a side view of one of the chip packages of FIGS. 1A-1D with compliant interconnects in accordance with an embodiment of the present disclosure.
Figure 14:
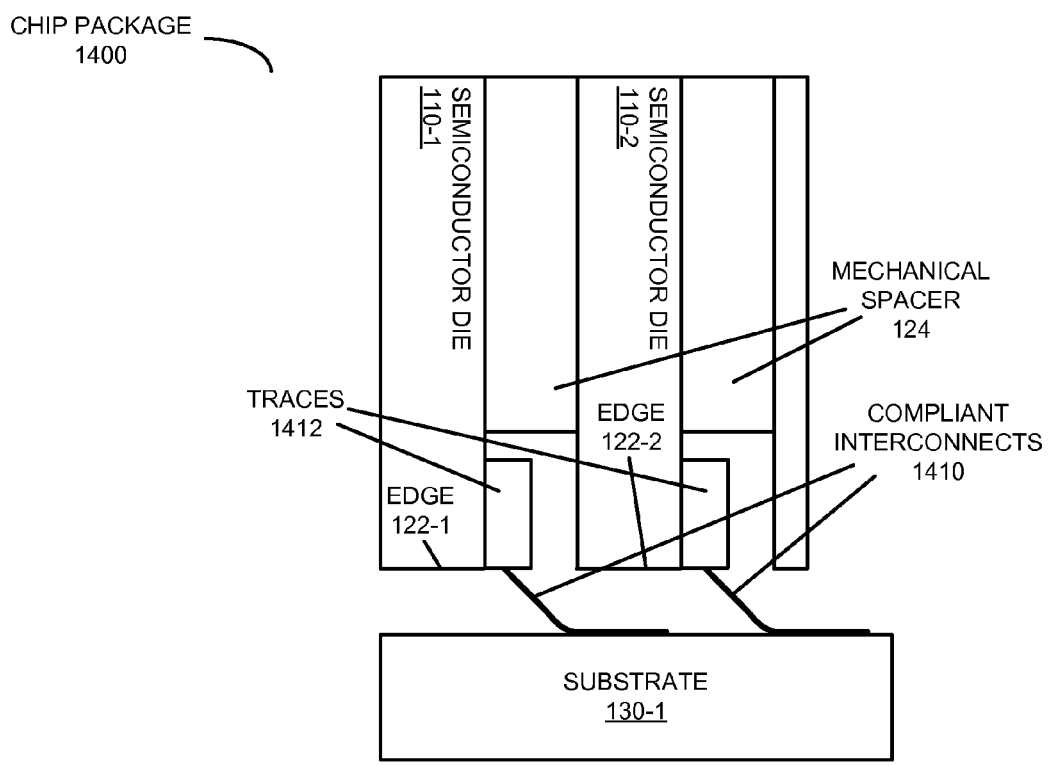
FIG. 14 is a block diagram illustrating a side view of one of the chip packages of FIGS. 1A-1D with compliant interconnects in accordance with an embodiment of the present disclosure.

We now consider options for the stack-to-substrate assembly. A variety of techniques may be used to electrically couple the semiconductor dies in the plank stack to the substrate, including: one or more levels of solder balls (such as a compound or stoichiometry of tin-lead, tin-silver-copper, indium, etc.); and/or a conductive adhesive that includes silver, copper and/or tin particles in one or more polymer binders. In some embodiments, flexible compliant interconnects, such as a spring connector or microspring, are used. These spring connectors may be fabricated on the semiconductor dies or the substrate. FIG. 13 presents a block diagram illustrating a side view of a chip package 1300, such as one of chip packages 100 (FIG. 1A), 140 (FIG. 1B), 160 (FIG. 1C) and/or 180 (FIG. 1D), with compliant interconnects 1310. These compliant interconnects may be used as the interface between the plank stack and substrate 130-1. Note that electrical coupling in FIG. 13 is made with the top of the bond pads. Alternatively, as shown in FIG. 14, which presents a block diagram illustrating a side view of a chip package 1400, such as one of chip packages 100 (FIG. 1A), 140 (FIG. 1B), 160 (FIG. 1C) and/or 180 (FIG. 1D), with compliant interconnects 1410, contact may be made with the side of thick plated traces 1412.

Figure 15:
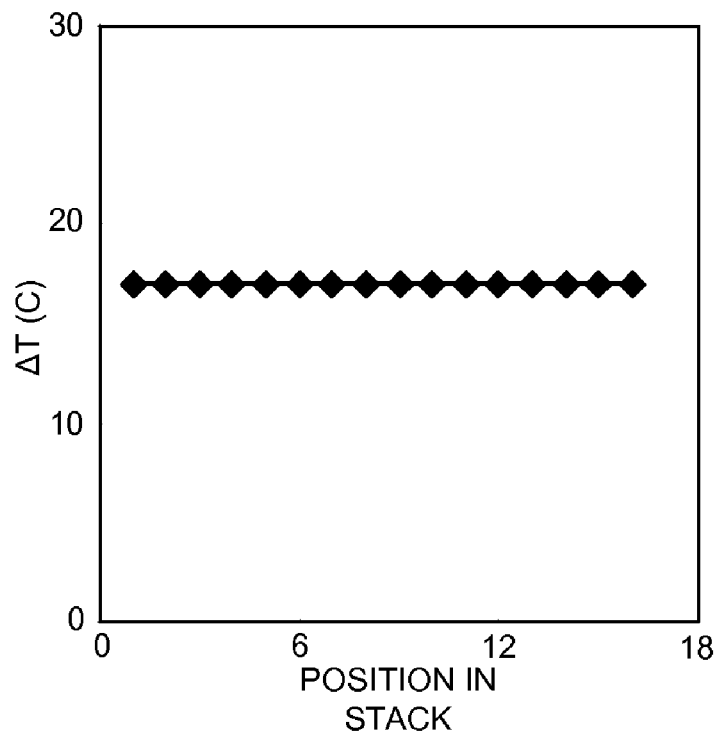
FIG. 15 is a graph of the temperature difference between a given semiconductor die and a heat sink as a function of position in a plank stack in the chip packages of FIGS. 1A-1D in accordance with an embodiment of the present disclosure.

We now consider options for thermal management in the plank stack. As shown in FIG. 1D, heat can be removed from the plank stack using an optional heat sink 190, which may interface with one or more sides or faces of plank stack 112. In contrast with existing stacked semiconductor dies, in the present disclosure heat may be extracted from the edges of semiconductor die 110 (as opposed to from the face of the semiconductor die at the end of the stack). As a consequence, the maximum temperature of a given semiconductor dies may be constant for all semiconductor dies 110 in plank stack 112 (i.e., the maximum temperature may be independent of the location of the given semiconductor die in plank stack 112). This is shown in FIG. 15, which presents a graph of the temperature difference between a given semiconductor die and a heat sink as a function of position in a plank stack in chip packages 100 (FIG. 1A), 140 (FIG. 1B), 160 (FIG. 1C) and/or 180 (FIG. 1D). Note that this uniform thermal management independent of the location in the plank stack is in contrast with existing 3D stacks of semiconductor dies, in which the maximum temperature of the semiconductor dies increases with distance from the heat sink at the end of the existing 3D stack. Moreover, because the temperature is independent of location, it may not limit the total number of semiconductor dies in a plank stack.

Figure 16:
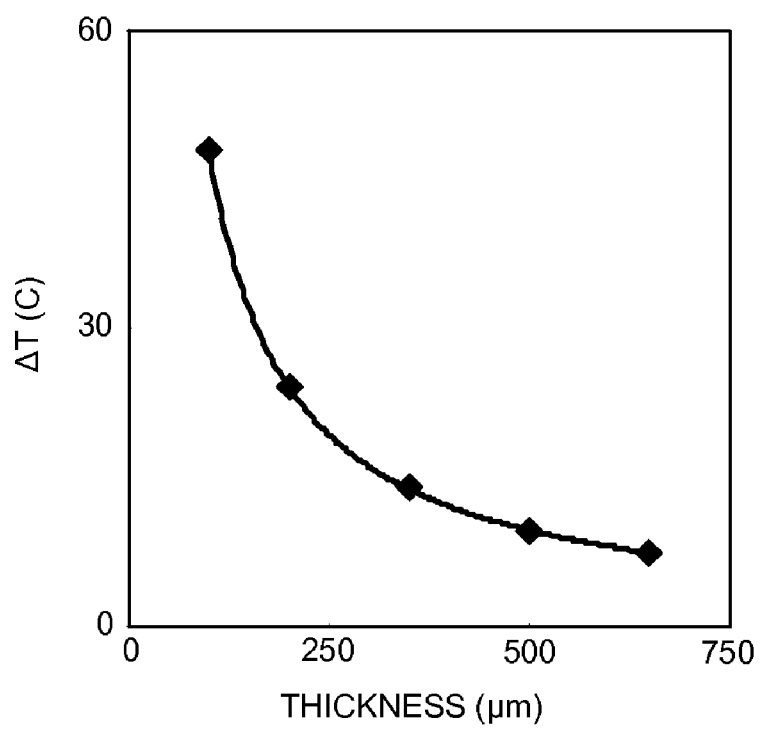
FIG. 16 is a graph of the temperature difference between a given semiconductor die and a heat sink as a function of a thickness of the given semiconductor die in the chip packages of FIGS. 1A-1D in accordance with an embodiment of the present disclosure.

FIG. 16 presents a graph of the temperature difference between a given semiconductor die and a heat sink as a function of a thickness of the given semiconductor die in chip packages 100 (FIG. 1A), 140 (FIG. 1B), 160 (FIG. 1C) and/or 180 (FIG. 1D). In particular, the maximum temperature of the semiconductor dies can be varied over a wide range by changing the thickness. This may facilitate increased design flexibility in controlling the thermal performance of the chip package compared with existing 3D stacks of semiconductor dies. In general, the semiconductor-die thickness may represent a tradeoff between the density for a given footprint (which favors a larger number of semiconductor dies and, thus, thinner semiconductor dies) and the thermal resistance (which favors thicker semiconductor dies). While not shown, note that the temperature distribution on the given semiconductor die in the plank stack is maximum at the edge of the semiconductor die that is farthest from the heat sink, and is lowest near to the heat sink. Moreover, the temperature difference on the given semiconductor die can be reduced by increasing the thickness of the given semiconductor die.

In an exemplary embodiment, the chip package may facilitate high-performance devices, such as a dual in-line memory module. For example, there may be up to 80 memory devices (such as dynamic random access memory or another type of memory-storage device) in the chip package. If needed, 'bad' or faulty memory devices can be disabled. Thus, 72 memory devices (out of 80) may be used. Furthermore, this configuration may expose the full bandwidth of the memory devices in the memory module, such that there is little or no latency delay in accessing any of the memory devices.

Alternatively, the dual in-line memory module may include multiple fields that each can include a chip package. For example, there may be four chip packages (which each include nine memory devices) in a dual in-line memory module.

In some embodiments, one or more of these dual in-line memory modules (which can include one or more chip packages) may be coupled to a processor, thereby bringing a high-chip-count memory stack closer to the processor. For example, the processor may be electrically coupled to the one or more dual in-line memory modules. In turn, the processor may be mounted on a substrate using C4 solder balls. Thus, the chip package may provide a low-latency and low-power link to the high-capacity memory.

Figure 17:
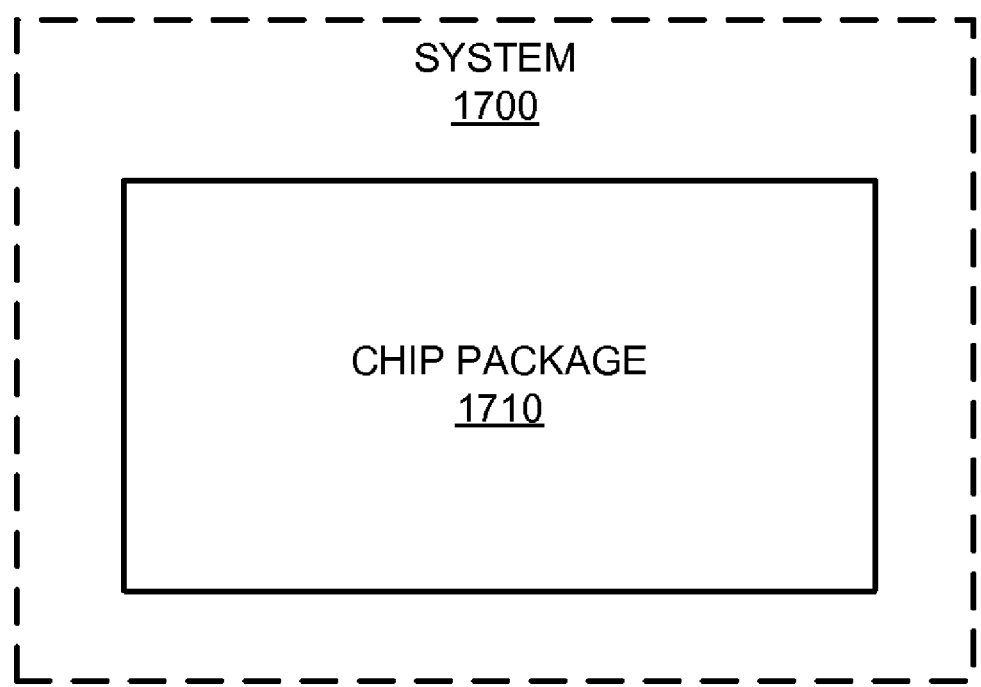
FIG. 17 is a block diagram illustrating a system that includes one or more of the chip packages of FIGS. 1A-1D in accordance with an embodiment of the present disclosure.

We now describe embodiments of the system (such as an electronic device and/or a computer system). FIG. 17 presents a block diagram illustrating a system 1700 that includes a chip package 1710, such as one or more of chip packages 100 (FIG. 1A), 140 (FIG. 1B), 160 (FIG. 1C) and/or 180 (FIG. 1D).

System 1700 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Note that a given computer system may be at one location or may be distributed over multiple, geographically dispersed locations.

The preceding embodiments of the chip package, as well as system 1700, may include fewer components or additional components. For example, in some embodiments there may be encapsulation around at least a portion of the chip package.

Moreover, although these chip packages and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. In addition, functionality in the preceding embodiments may be implemented more in hardware and less in software, or less in hardware and more in software, as is known in the art.

While the preceding embodiments illustrate particular configurations of the chip package, a number of techniques and configurations may be used to implement mechanical alignment of components.

Moreover, while the preceding embodiments use semiconductor dies (such as silicon) in the chip package, in other embodiments a different material than a semiconductor may be used as the substrate material in one or more of the chips. However, in embodiments in which silicon is used, the semiconductor dies may be fabricated using standard silicon processing. These semiconductor dies may provide silicon area that supports logic and/or memory functionality.

Furthermore, referring back to FIG. 1A, in some embodiments substrate 130-1 may be a passive component, such as a plastic substrate with metal traces to electrically couple to semiconductor dies 110. For example, substrate 130-1 may be fabricated using injection-molded plastic. Alternatively, as discussed previously, substrate 130-1 may be another semiconductor die with one or more lithographically defined wires, and/or signal lines. In embodiments where substrate 130-1 includes a semiconductor die, active devices, such as limit amplifiers, may be included to reduce cross-talk between the signal lines. Additionally, cross-talk may be reduced in either an active or a passive substrate 130-1 using differential signaling.

In some embodiments, substrate 130-1 includes transistors and wires that shuttle data and power signals among semiconductor dies 110 via intervening conductive material 136. For example, substrate 130-1 may include high-voltage signals. These signals may be stepped down for use on semiconductor dies 110 using: a step-down regulator (such as a capacitor-to-capacitor step-down regulator), as well as capacitor and/or inductor discrete components to couple to semiconductor dies 110.

Additionally, substrate 130-1 may include a buffer or logic chip for memory, and/or I/O connectors to external device(s) and/or system(s). For example, the I/O connectors may include one or more: ball bonds, wire bonds, and/or edge connectors and/or for coupling to external devices. In some embodiments, these I/O connectors may be on a back surface of substrate 130-1, and substrate 130-1 may include one or more TSVs that couple the I/O connectors to additional connectors near semiconductor dies 110, such as solder pads.

In some embodiments, substrate 130-1 and semiconductor dies 110 in one or more embodiments of the chip package are mounted on an optional substrate (such as a printed circuit board or a semiconductor die). This optional substrate may include: ball bonds, wire bonds, edge connectors, solder bumps (such as C4), spring connectors, and/or socket connectors for coupling to external devices. If these I/O connectors are on a back surface of the optional substrate, the optional substrate may include one or more TSVs.

In some embodiments, mechanical spacer 124 includes a heat-spreading material (and, more generally, an intermediate material between semiconductor dies 110 that has a high thermal conductivity), which may help remove heat generated during operation of circuits on one or more semiconductor dies 110 and/or substrate 130-1. This thermal management may include any of the following thermal paths: a first thermal path in the plane of semiconductor dies 110; a second thermal path in the plane of mechanical spacer 124; and/or a third thermal path in the plane of the heat-spreading material. Note that this thermal management may include the use of: phase change cooling, immersion cooling, and/or a cold plate. Also note that the thermal flux associated with the first thermal path that diffuses through the cross-sectional area at the edge of the chip package is a function of the thickness of semiconductor dies 110 (such as thickness 126). Thus, the thermal management may be different in chip packages with larger or smaller nominal thicknesses of semiconductor dies 110.

Note that packaging techniques that allow some rework are more cost-effective when faced with lower semiconductor-die yields or high expense to test extensively before packaging and assembly. Therefore, in embodiments where the mechanical and/or electrical coupling between semiconductor dies 110 and substrate 130-1 are remateable, the yield of the chip package may be increased by allowing rework (such as replacing a bad chip that is identified during assembly, testing or burn-in). In this regard, remateable mechanical or electrical coupling should be understood to be mechanical or electrical coupling that can be established and broken repeatedly (i.e., two or more times) without requiring rework or heating (such as with solder). In some embodiments, the remateable mechanical or electrical coupling involves male and female components designed to couple to each other (such as components that snap together).

Figure 18:
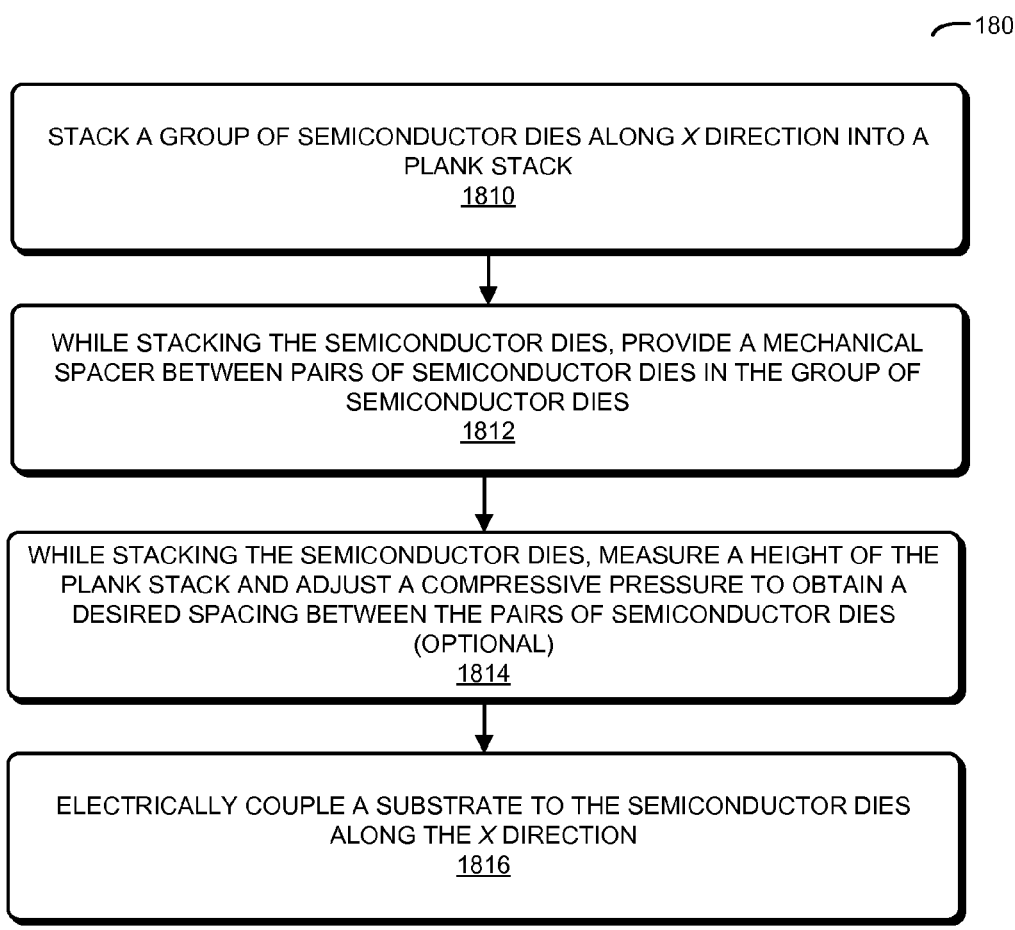
FIG. 18 is a flow diagram illustrating a method for fabricating a plank stack of semiconductor dies in the chip packages of FIGS. 1A-1D in accordance with an embodiment of the present disclosure.

We now describe embodiments of the method. FIG. 18 presents a flow diagram illustrating a method 1800 for fabricating a plank stack of semiconductor dies in chip packages 100 (FIG. 1A), 140 (FIG. 1B), 160 (FIG. 1C) and/or 180 (FIG. 1D). During this method, the semiconductor dies are stacked along the x direction into a plank stack (operation 1810), where the plane of the given semiconductor die is defined by the z direction and the y direction, and the z direction, the x direction and the y direction are substantially perpendicular to each other. Note that the semiconductor dies include the first electrical pads proximate to edges of the semiconductor dies, and the edges of the semiconductor dies define the face of the plank stack. Moreover, while stacking the semiconductor dies, mechanical spacer may be provided between the pairs of semiconductor dies in the group of semiconductor dies (operation 1812). Furthermore, the substrate may be electrically coupled to the semiconductor dies along the x direction (operation 1816), where the plane of the substrate is defined by the x direction and the y direction. The electrical coupling to the semiconductor dies may be between the first electrical pads, the second electrical pads, proximate to the surface of the substrate along the x direction, and the intervening conductive material between the first electrical pads and the second electrical pads.

In some embodiments, while stacking the semiconductor dies, a height of the plank stack is optionally measured and a compressive pressure is adjusted to obtain desired spacing between the pairs of semiconductor dies (operation 1814), thereby facilitating electrical coupling to the second electrical pads proximate to the surface of the substrate.

Additionally, the stacking may occur before the semiconductor dies are diced from their associated wafers. Thus, wafer-level or die-level stacking may be used during the method.

In some embodiments of method 1800 there may be additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
a group of semiconductor dies arranged in a plank stack in an x direction, wherein a plane of a given semiconductor die is defined by a z direction and a y direction, wherein a surface for the plane comprises active electronics, wherein the z direction, the x direction and the y direction are substantially perpendicular to each other, wherein the semiconductor dies include first electrical pads proximate to edges of the semiconductor dies, and wherein the edges of the semiconductor dies define a face of the plank stack;
a mechanical spacer between pairs of semiconductor dies in the group of semiconductor dies; and
a substrate electrically coupled to the semiconductor dies along the x direction, wherein a plane of the substrate is defined by the x direction and the y direction; and
wherein the electrical coupling to the semiconductor dies is between the first electrical pads, second electrical pads, proximate to a surface of the substrate along the x direction, and an intervening conductive material between the first electrical pads and the second electrical pads.

2. The chip package of claim 1, wherein the semiconductor dies have a common orientation so that active electronics proximate to surfaces of the semiconductor dies are on a common side of the semiconductor dies.

3. The chip package of claim 1, wherein pairs of adjacent semiconductor dies in the plank stack have opposite orientations so that active electronics proximate to surfaces of the pairs of adjacent semiconductor dies face each other.

4. The chip package of claim 1, wherein the semiconductor dies include third electrical pads, proximate to the edges of the semiconductor dies along the y direction;
wherein the substrate is further electrically coupled to the semiconductor dies along the y direction; and
wherein the electrical coupling to the semiconductor dies is between the third electrical pads, fourth electrical pads, proximate to the surface of the substrate along the y direction, and the intervening conductive material between the third electrical pads and the fourth electrical pads.

5. The chip package of claim 1, wherein the second electrical pads include one of: discrete pads and a continuous electrical signal line on the substrate.

6. The chip package of claim 1, wherein the mechanical spacer includes spheres that define a spacing between the pairs of semiconductor dies.

7. The chip package of claim 1, wherein the chip package further includes spacer bumps, mechanically coupled to surfaces of the pairs of semiconductor dies; and
wherein the spacer bumps define a spacing between the pairs of semiconductor dies.

8. The chip package of claim 1, wherein the intervening conductive material includes one of: solder, partially ground conductive material having a modified aspect ratio than that of un-ground conductive material, stud bumps, plated traces, wire bonds, spring connectors that are electrically coupled to the substrate, traces defined using tape automated bonding, and a conductive adhesive.

9. The chip package of claim 1, wherein the intervening conductive material extends beyond a guard ring associated with the given semiconductor die.

10. The chip package of claim 1, wherein the mechanical spacer is recessed from the first electrical pads in spaces between the pairs of semiconductor dies.

11. The chip package of claim 1, wherein the mechanical spacer fills the spaces between the pairs of semiconductor dies down to the first electrical pads.

12. The chip package of claim 1, wherein the semiconductor dies include third electrical pads proximate to additional edges of the semiconductor dies;
   wherein the additional edges of the semiconductor dies define another face of the plank stack;
   wherein the chip package further includes another substrate that is electrically coupled to the semiconductor dies along one of the x direction or the y direction; and
   wherein the electrical coupling to the semiconductor dies is between the third electrical pads, fourth electrical pads, proximate to the surface of the substrate along the z direction, and the intervening conductive material between the third electrical pads and the fourth electrical pads.

13. The chip package of claim 1, wherein the chip package includes a heat sink thermally coupled to at least another face of the plank stack than the face of the plank stack, thereby extracting heat from one or more faces of the plank stack.

14. The chip package of claim 1, wherein the group of semiconductor dies includes at least two subsets of semiconductor dies that are separated by a gap along the x direction; and
   wherein a given subset of the semiconductor dies includes at least two semiconductor dies.

15. The chip package of claim 1, wherein the mechanical spacer includes an adhesive.

16. A system, comprising a chip package, wherein the chip package includes:
   a group of semiconductor dies arranged in a plank stack in an x direction, wherein a plane of a given semiconductor die is defined by a z direction and a y direction, wherein a surface for the plane comprises active electronics, wherein the z direction, the x direction and the y direction are substantially perpendicular to each other, wherein the semiconductor dies include first electrical pads proximate to edges of the semiconductor dies; and wherein the edges of the semiconductor dies define a face of the plank stack;
   a mechanical spacer between pairs of semiconductor dies in the group of semiconductor dies; and
   a substrate electrically coupled to the semiconductor dies along the x direction, wherein a plane of the substrate is defined by the x direction and the y direction; and
   wherein the electrical coupling to the semiconductor dies is between the first electrical pads, second electrical pads, proximate to a surface of the substrate along the x direction, and an intervening conductive material between the first electrical pads and the second electrical pads.

17. The chip package of claim 1, wherein the surface for the plane is defined by the z direction and the y direction and is substantially parallel to the plane.

18. The chip package of claim 1, wherein the plane for the given semiconductor die is substantially parallel to a plane of another semiconductor die in the group that is defined by the z direction and the y direction.

19. The chip package of claim 1, wherein, for each semiconductor die in the semiconductor dies:
   a plane for the semiconductor die is defined by the z direction and the y direction,
   the plane for the semiconductor die is substantially parallel to each of the planes for the semiconductor dies, and
   a surface for the plane for the semiconductor die that is substantially parallel to the plane comprises active electronics for the semiconductor die.

20. The chip package of claim 17, wherein, for each semiconductor die in the semiconductor dies, the first electrical pads for the semiconductor die are disposed on the surface for the plane for the semiconductor die.

\* \* \* \* \*